(12) United States Patent
Baker et al.

(10) Patent No.: US 12,550,650 B2
(45) Date of Patent: Feb. 10, 2026

(54) METHOD OF FORMING AN INTEGRATED CIRCUIT VIA

(71) Applicant: Microchip Technology Incorporated, Chandler, AZ (US)

(72) Inventors: Daniel Baker, Phoenix, AZ (US); Justin Sato, West Linn, OR (US); Chris Sundahl, Gresham, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 812 days.

(21) Appl. No.: 17/888,057

(22) Filed: Aug. 15, 2022

(65) Prior Publication Data

US 2023/0050344 A1 Feb. 16, 2023

Related U.S. Application Data

(60) Provisional application No. 63/233,426, filed on Aug. 16, 2021.

(51) Int. Cl.
*H01L 21/311* (2006.01)
*H01L 21/027* (2006.01)
(Continued)

(52) U.S. Cl.
CPC .... *H01L 21/31144* (2013.01); *H01L 21/0274* (2013.01); *H01L 21/76807* (2013.01);
(Continued)

(58) Field of Classification Search
CPC ........... H01L 21/31144; H01L 21/0274; H01L 21/76807; H01L 21/76816;
(Continued)

(56) References Cited

U.S. PATENT DOCUMENTS

| | | | |
|---|---|---|---|
| 6,444,557 B1 | 9/2002 | Biolsi et al. | 438/597 |
| 2004/0198062 A1 | 10/2004 | Ye et al. | 438/706 |

(Continued)

FOREIGN PATENT DOCUMENTS

EP 0890984 A1 1/1999 ............ H01L 21/28

OTHER PUBLICATIONS

Zhou (Year: 2018).*
International Search Report and Written Opinion, Application No. PCT/US2022/040468, 16 pages, Jan. 3, 2023.

*Primary Examiner* — Caleen O Sullivan
(74) *Attorney, Agent, or Firm* — SLAYDEN GRUBERT BEARD PLLC

(57) ABSTRACT

A method of forming a via is provided. A lower metal element is formed, and a first patterned photoresist is used to form a sacrificial element over the lower metal element. A dielectric region including a dielectric element projection extending upwardly above the sacrificial element is formed. A second patterned photoresist including a second photoresist opening is formed, wherein the dielectric element projection is at least partially located in the second photoresist opening. A dielectric region trench opening is etched in the dielectric region. The sacrificial element is removed to define a via opening extending downwardly from the dielectric region trench opening. The dielectric region trench opening and the via opening are filled to define (a) an upper metal element in the dielectric region trench opening and (b) a via in the via opening, wherein the via extends downwardly from the upper metal element.

20 Claims, 24 Drawing Sheets

(51) Int. Cl.
  *H01L 21/768* (2006.01)
  *H01L 23/522* (2006.01)
(52) U.S. Cl.
  CPC .. *H01L 21/76816* (2013.01); *H01L 21/76877* (2013.01); *H01L 23/5226* (2013.01)
(58) Field of Classification Search
  CPC ........... H01L 21/76877; H01L 23/5226; H01L 2221/1026
  USPC ....................................................... 257/774
  See application file for complete search history.

(56) References Cited

U.S. PATENT DOCUMENTS

| | | | |
|---|---|---|---|
| 2016/0056104 A1 | 2/2016 | Bouche et al. | 257/741 |
| 2021/0149313 A1* | 5/2021 | Volkovich | G03F 7/705 |

\* cited by examiner

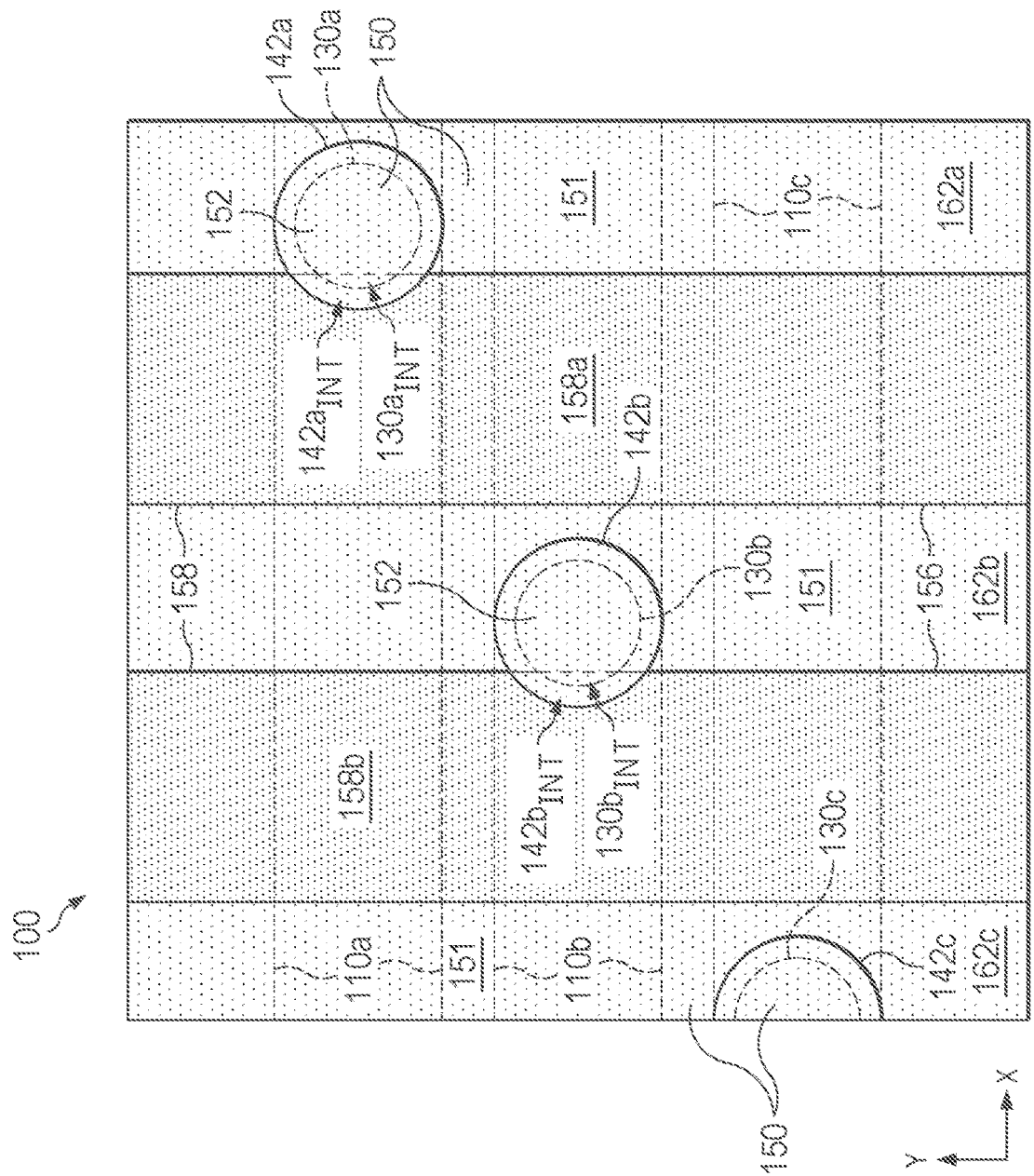

METHOD OF FORMING AN INTEGRATED CIRCUIT VIA

RELATED PATENT APPLICATION

This application claims priority to commonly owned U.S. Provisional Patent Application No. 63/233,426 filed Aug. 16, 2021, the entire contents of which are hereby incorporated by reference for all purposes.

TECHNICAL FIELD

The present disclosure relates to integrated circuit fabrication, and more particularly to methods of forming an integrated circuit via.

BACKGROUND

A typical integrated circuit (IC) device includes multiple levels of metal interconnect (metal layers) connected by vertically-extending vias, defining various circuitry with in the IC device. As more electronic devices (e.g., transistors) are packed into an IC device, the critical dimensions (e.g., pitch) of IC structures, e.g., electronic device structures and/or metal interconnect structures, continue to shrink. This reduction of critical dimensions creates a technical challenge for the formation of certain IC structures, including vias (e.g., interconnect vias), using photolithographic processes. For example, as critical dimensions reduce, fabrication process-related misalignments between vias and adjacent metal layer structures generally have an increasing negative effect on the quality and reliability of electrical connections between the respective vias and metal layer structures.

Interconnect vias are commonly formed using a self-aligned dual damascene (SADD) process. In a conventional SADD process, an etch stop layer is formed over an inter-metal dielectric (IMD) region and etch stop layer openings are formed in the etch stop layer (for subsequently forming vias) using a darkfield resist patterning technique. A dielectric region (e.g., oxide region) is formed over the etch stop layer (including over the etch stop layer openings), and trench openings are etched in the dielectric region using a patterned photomask.

A via etch is then performed through the trench openings and through the underlying etch stop layer openings to form via openings in the IMD region. In some instances the trench openings are at least partially misaligned (in a lateral direction) with the underlying etch stop layer openings, e.g., due to alignment margins of the patterned photomask used to form the trench openings. Due to this misalignment, the via openings formed by the via etch may have a reduced size, for example the via openings may have a partial cylinder shape as opposed to a full cylinder. Such reduced size via openings may be referred to as partial via openings.

After the via etch, a dual damascene metal deposition is performed to form metal lines in the trench openings and vias in the underlying partial via openings. The vias formed in the partial via openings may be referred to as partial vias, e.g., have a partial cylinder shape as opposed to a full cylinder shape. These partial vias may provide reduced quality electrical connections with adjacent metal elements, e.g., interconnect lines formed in the metal layer above and/or the metal layer below the partial vias.

There is a need for improved methods for forming vias.

SUMMARY

The present disclosure provides methods for forming vias, e.g., interconnect vias. In some examples, a sacrificial element (for subsequently defining a via opening) is formed over a lower metal element, followed by deposition of a dielectric region including a dielectric element projection extending upwardly above the sacrificial element. A patterned photoresist is formed over the dielectric region, wherein the dielectric element projection projects upwardly through patterned photoresist. The dielectric element projection and sacrificial element are subsequently removed, leaving a via opening extending downward from an etched trench opening. The trench opening and via opening may be filled with metal, e.g., according to a dual damascene process, to form a metal line and a via extending downwardly from the metal line.

In some examples, the sacrificial element may be formed using a bright field photomask to define a photoresist element (e.g., a cylinder or other vertically-extending prism) over a sacrificial material layer, and etching the sacrificial material layer uncovered by the photoresist element.

The disclosed methods may form full-sized vias, regardless of certain process-related misalignments that may result in partial or delimited vias using certain conventional fabrication methods. For example, in an instance in which the patterned photoresist formed over the dielectric region is misaligned, the dielectric element projection extending over the sacrificial element blocks the patterned photoresist from covering the sacrificial element, thus allowing the sacrificial element to be fully removed and a via formed in the resulting via opening without being restricted or delimited by the patterned photoresist.

One aspect provides a method of forming a via. A sacrificial material layer is deposited over an integrated circuit structure. A first photoresist layer is formed over the sacrificial material layer. The first photoresist layer is patterned to define a first photoresist element. The sacrificial material layer is etched to form a sacrificial element below the first photoresist element. A dielectric region is deposited, which includes a dielectric element projection extending upwardly above the sacrificial element. A second photoresist layer is formed and patterned to form a second photoresist opening in the second photoresist layer, wherein the dielectric element projection is at least partially located in the second photoresist opening. An etch is performed to etch through the second photoresist opening to form a dielectric region trench opening in the dielectric region. The sacrificial element is removed to define a via opening extending below the dielectric region trench opening. The dielectric region trench opening and the via opening are filled to define (a) a metal element in the dielectric region trench opening and (b) a via in the via opening, wherein the via extends downwardly from the metal element.

In some examples, patterning the first photoresist layer to define the first photoresist element comprises using a bright field photomask to pattern the first photoresist layer.

In some examples, the first photoresist element comprises a vertically-extending photoresist pillar, and the sacrificial element comprises a vertically-extending sacrificial pillar.

In some examples, the sacrificial element is laterally misaligned with the second photoresist opening. In some examples, a perimeter of the sacrificial element extends laterally beyond a perimeter of the second photoresist opening.

In some examples, the method includes filling the dielectric region trench opening and the via opening using a dual damascene process.

In some examples, the sacrificial material layer comprises polyimide.

In some examples, the sacrificial material layer comprises nitride, polysilicon, or aluminum.

In some examples, the method includes etching the sacrificial element to reduce a lateral width of the sacrificial element before depositing the dielectric region.

In some examples, the method includes forming an anti-reflective coating over the dielectric region, the anti-reflective coating including a cap portion covering an upper portion of the dielectric element projection, forming the second photoresist layer over the anti-reflective coating, removing the cap portion of the anti-reflective coating after patterning the second photoresist layer, and removing at least a partial vertical height of the dielectric element projection.

In some examples, the dielectric element projection projects upwardly higher than a top surface of the second photoresist layer.

In some examples, the deposited dielectric region encloses the sacrificial element.

Some examples provides a method of forming a via in which a lower metal element is formed, and a first patterned photoresist is used to form a sacrificial element over the lower metal element. A dielectric region including a dielectric element projection extending upwardly above the sacrificial element is formed. A second patterned photoresist including a second photoresist opening is formed, wherein the dielectric element projection is at least partially located in the second photoresist opening. A dielectric region trench opening is etched in the dielectric region. The sacrificial element is removed to define a via opening extending downwardly from the dielectric region trench opening. The dielectric region trench opening and the via opening are filled to define (a) an upper metal element in the dielectric region trench opening and (b) a via in the via opening, wherein the via extends downwardly from the upper metal element.

In some examples, using the first patterned photoresist to form the sacrificial element over the lower metal element includes patterning the first photoresist using a bright field photomask to define a first photoresist element, and etching the sacrificial material layer to form the sacrificial element below the first photoresist element.

In some examples, the method includes filling the dielectric region trench opening and the via opening using a dual damascene process.

In some examples, the method includes forming an anti-reflective coating over the dielectric region, the anti-reflective coating including a cap portion covering an upper portion of the dielectric element projection, forming the second photoresist layer over the anti-reflective coating, removing the cap portion of the anti-reflective coating after forming the second patterned photoresist, and removing at least a partial vertical height of the dielectric element projection.

In some examples, a perimeter of the sacrificial element extends laterally beyond a perimeter of the second photoresist opening.

Some examples provides a method of forming a via using a bright field photomask. A sacrificial material layer is formed in an integrated circuit structure. A bright field photomask is used to define a first photoresist element over the sacrificial material layer. The sacrificial material layer is etched to form a sacrificial element below the first photoresist element. A dielectric region is formed over the sacrificial material layer, the dielectric region including a dielectric element projection extending upwardly above the sacrificial element. A dielectric region trench opening is etched in the dielectric region, the dielectric region trench opening exposing a surface of the sacrificial element. The sacrificial element is removed to define a via opening. The dielectric region trench opening and the via opening are filled to define (a) an upper metal element in the dielectric region trench opening and (b) a via in the via opening.

In some examples, after forming the dielectric region over the sacrificial material layer, a second patterned photoresist including a second photoresist opening is formed, wherein the dielectric element projection is at least partially located in the second photoresist opening. The dielectric region trench opening is etched through the second photoresist opening.

In some examples, the method includes forming the sacrificial material layer over a lower metal element, wherein the via opening defined by removing the sacrificial element exposes an upper surface of the lower metal element.

Some examples provide an integrated circuit device formed by a process including: depositing a sacrificial material layer over an integrated circuit structure; forming a first photoresist layer over the sacrificial material layer; patterning the first photoresist layer to define a first photoresist element; etching the sacrificial material layer to form a sacrificial element below the first photoresist element; depositing a dielectric region including a dielectric element projection extending upwardly above the sacrificial element; forming a second photoresist layer; patterning the second photoresist layer to form a second photoresist opening in the second photoresist layer, wherein the dielectric element projection is at least partially located in the second photoresist opening; etching through the second photoresist opening to form a dielectric region trench opening in the dielectric region; removing the sacrificial element to define a via opening extending below the dielectric region trench opening; and filling the dielectric region trench opening and the via opening to define (a) a metal element in the dielectric region trench opening and (b) a via in the via opening, wherein the via extends downwardly from the metal element.

BRIEF DESCRIPTION OF THE DRAWINGS

Example aspects of the present disclosure are described below in conjunction with the figures, in which.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
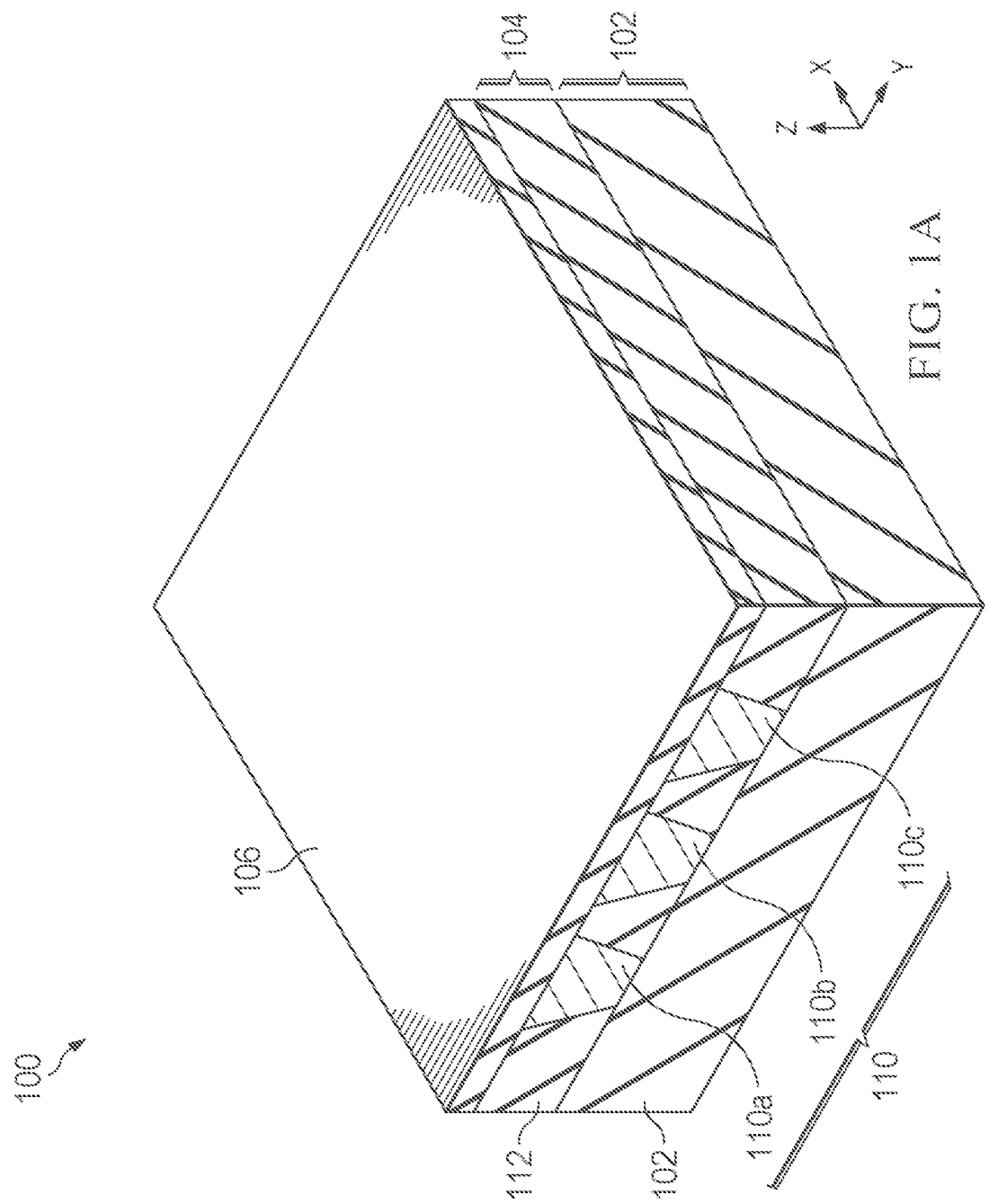
FIGS. 1A-1U illustrates an example process for forming an integrated circuit structure including interconnect vias using a bright field resist patterning technique, according to one example.
Figure 1B:
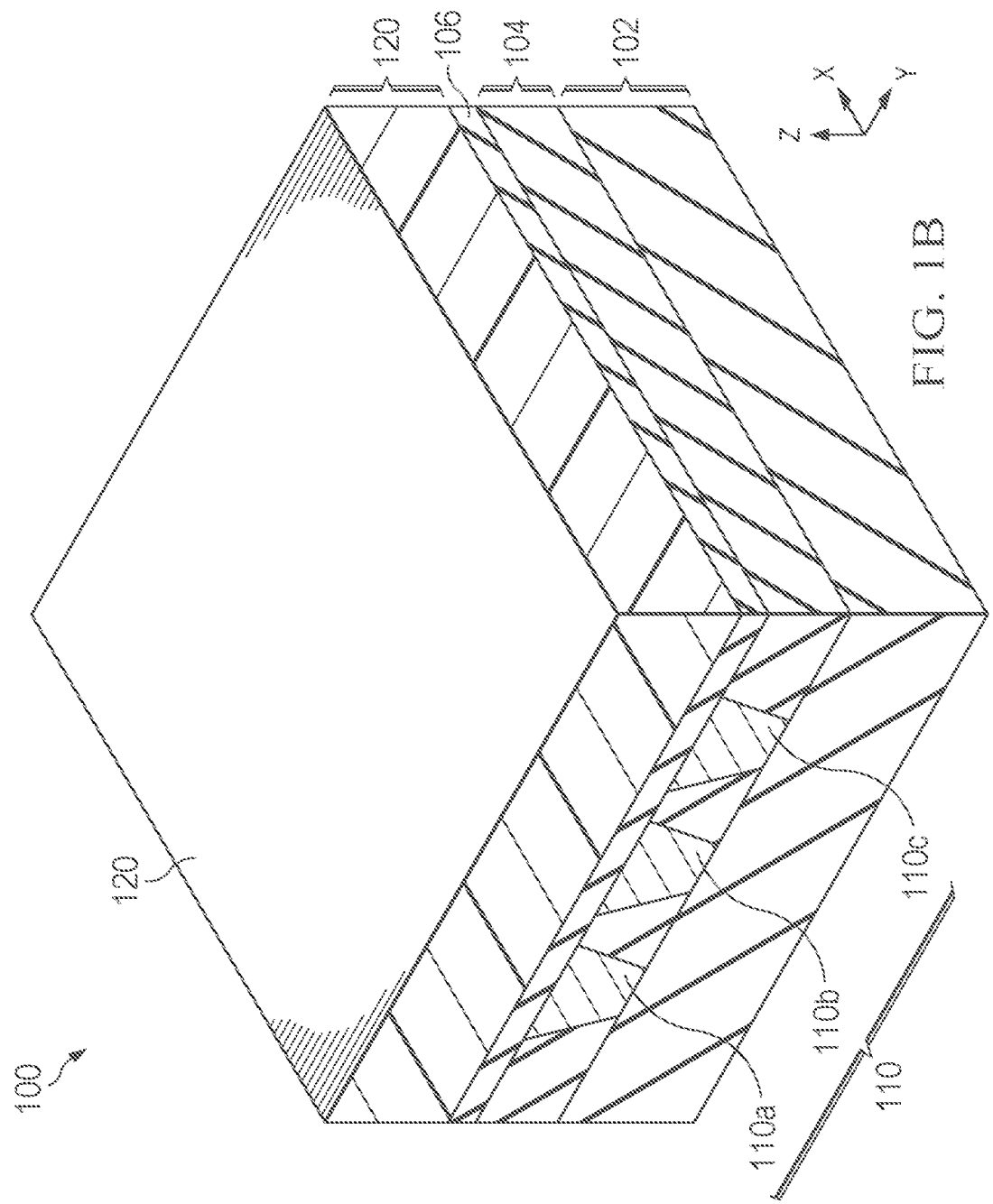
Figure 1C:
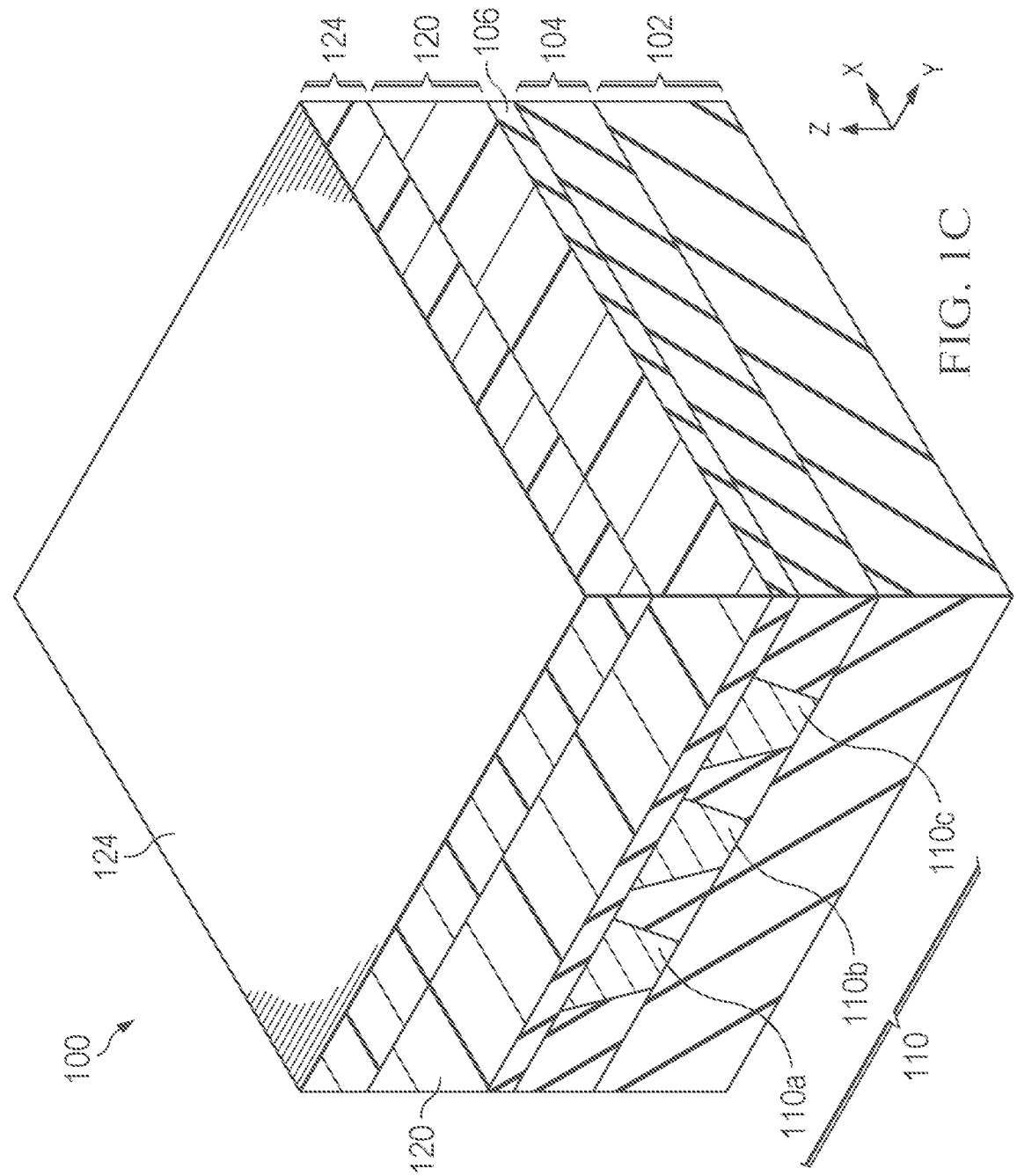
Figure 1D:
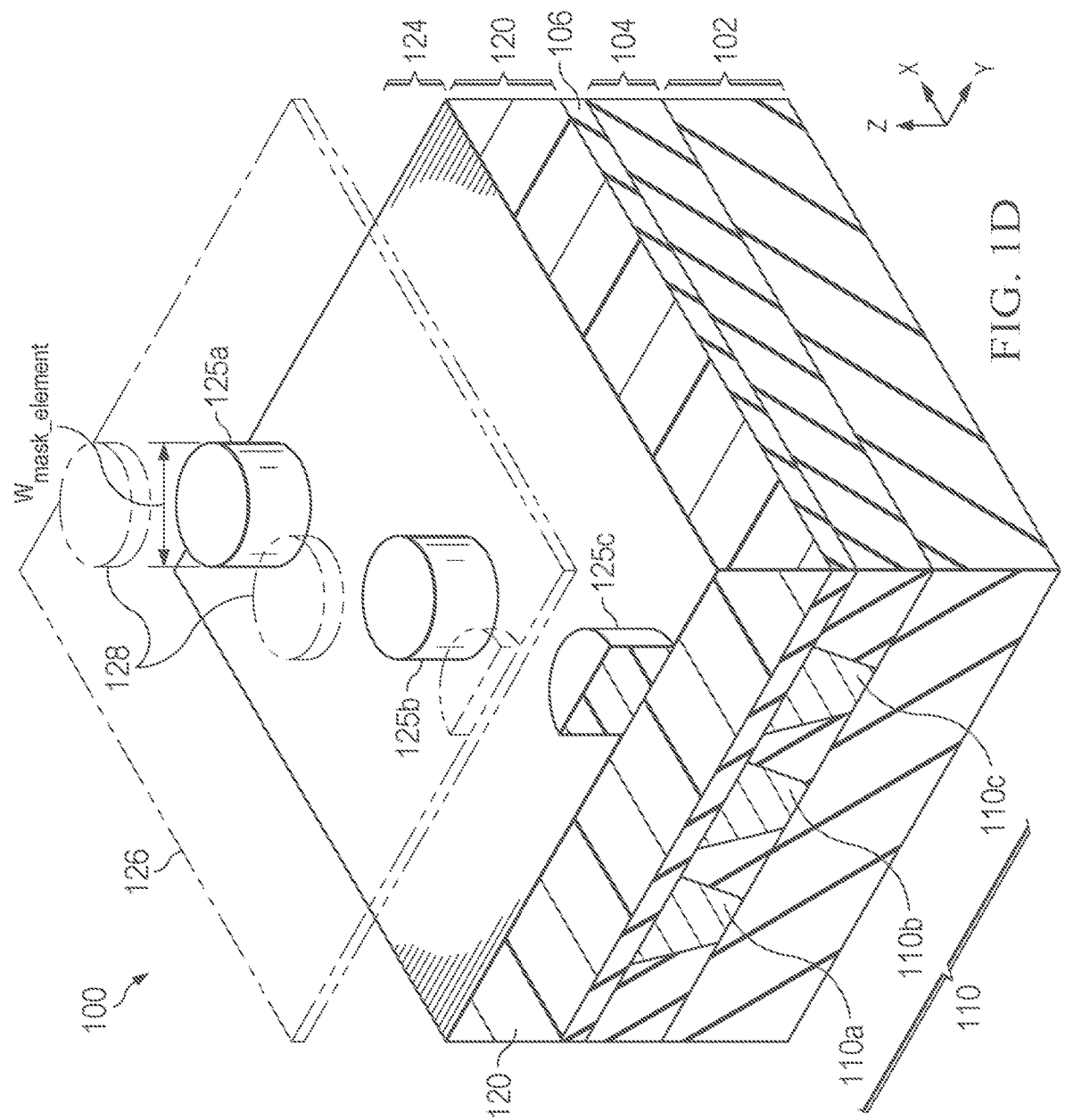
Figure 1E:
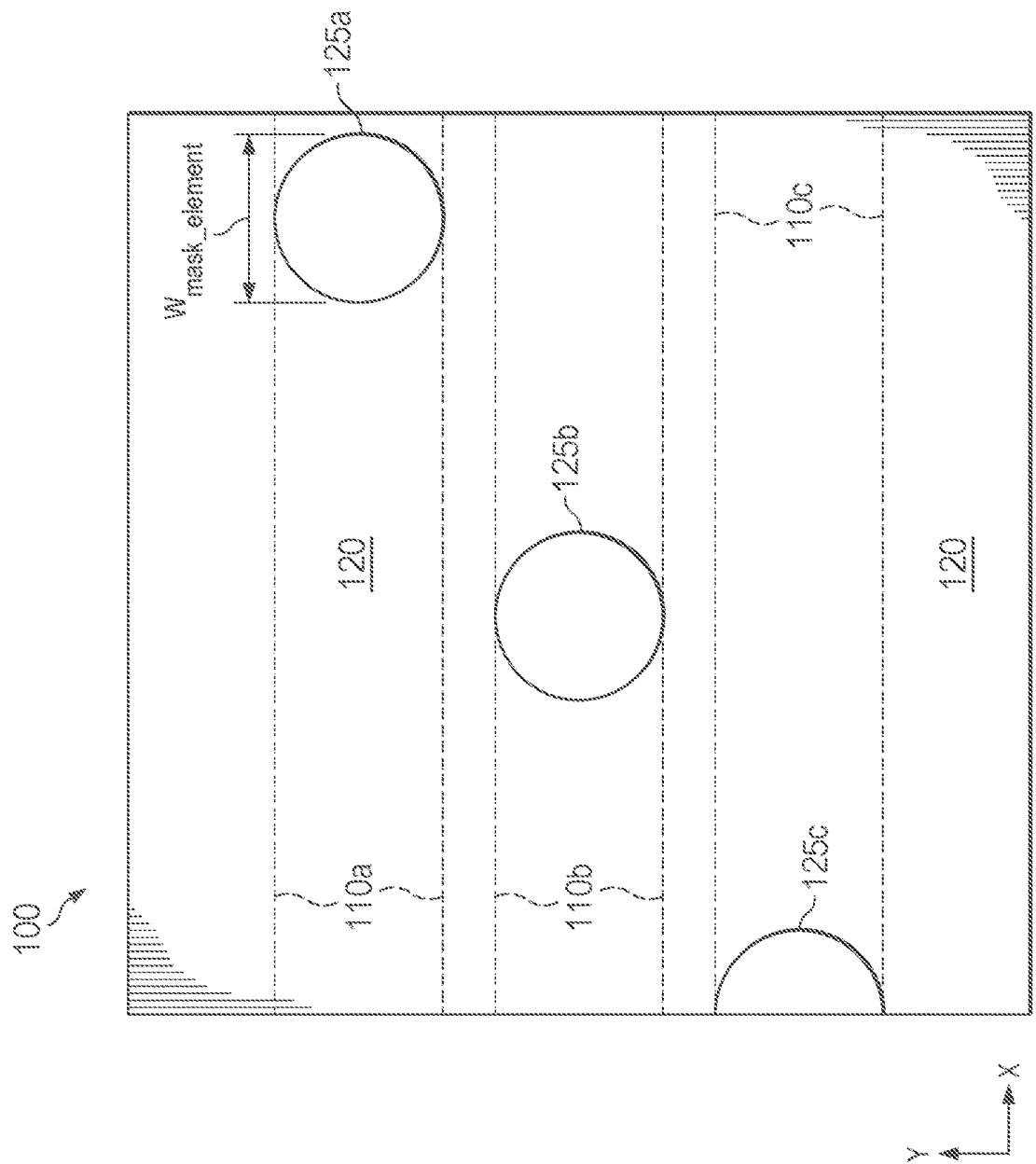
Figure 1F:
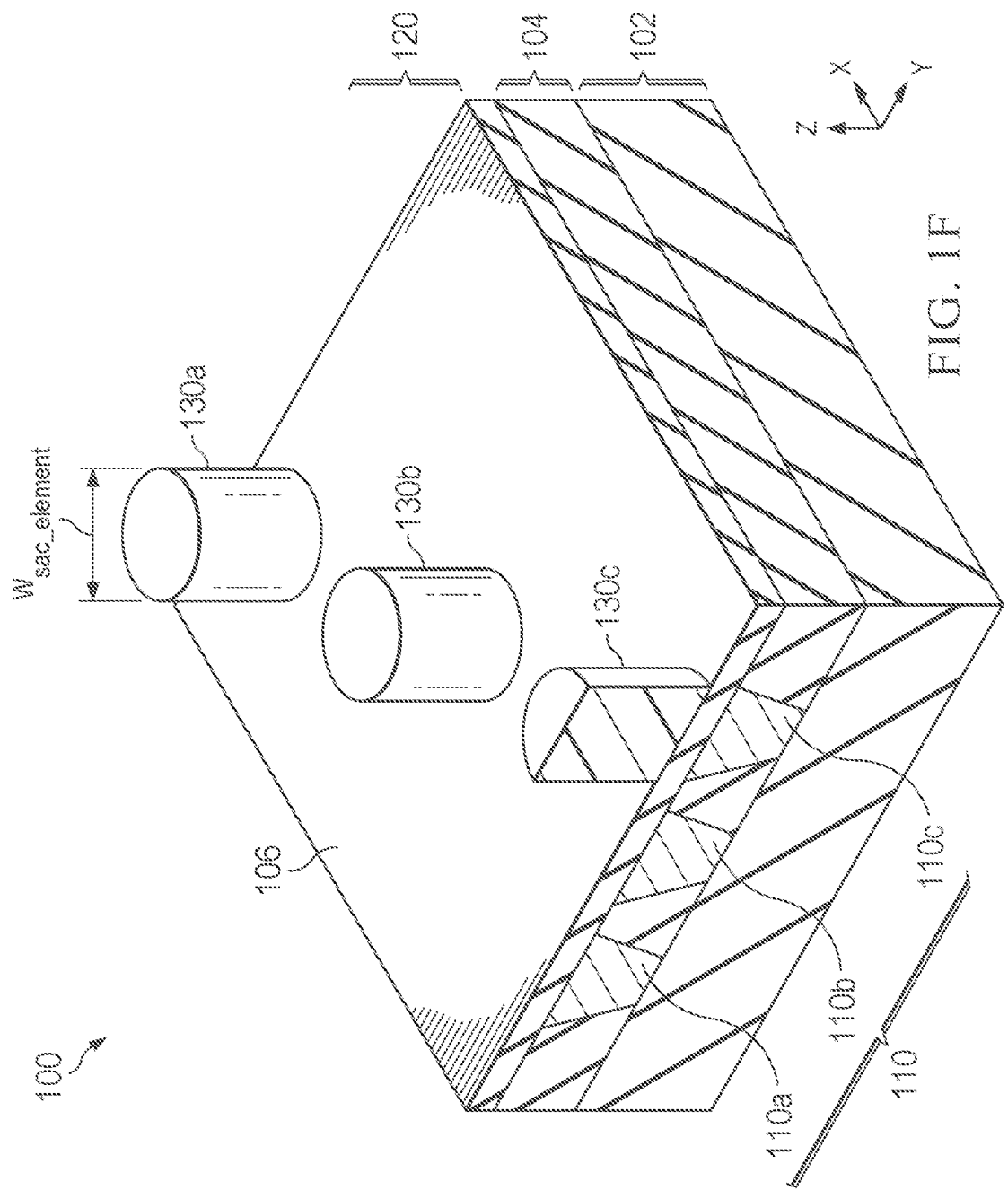
Figure 1G:
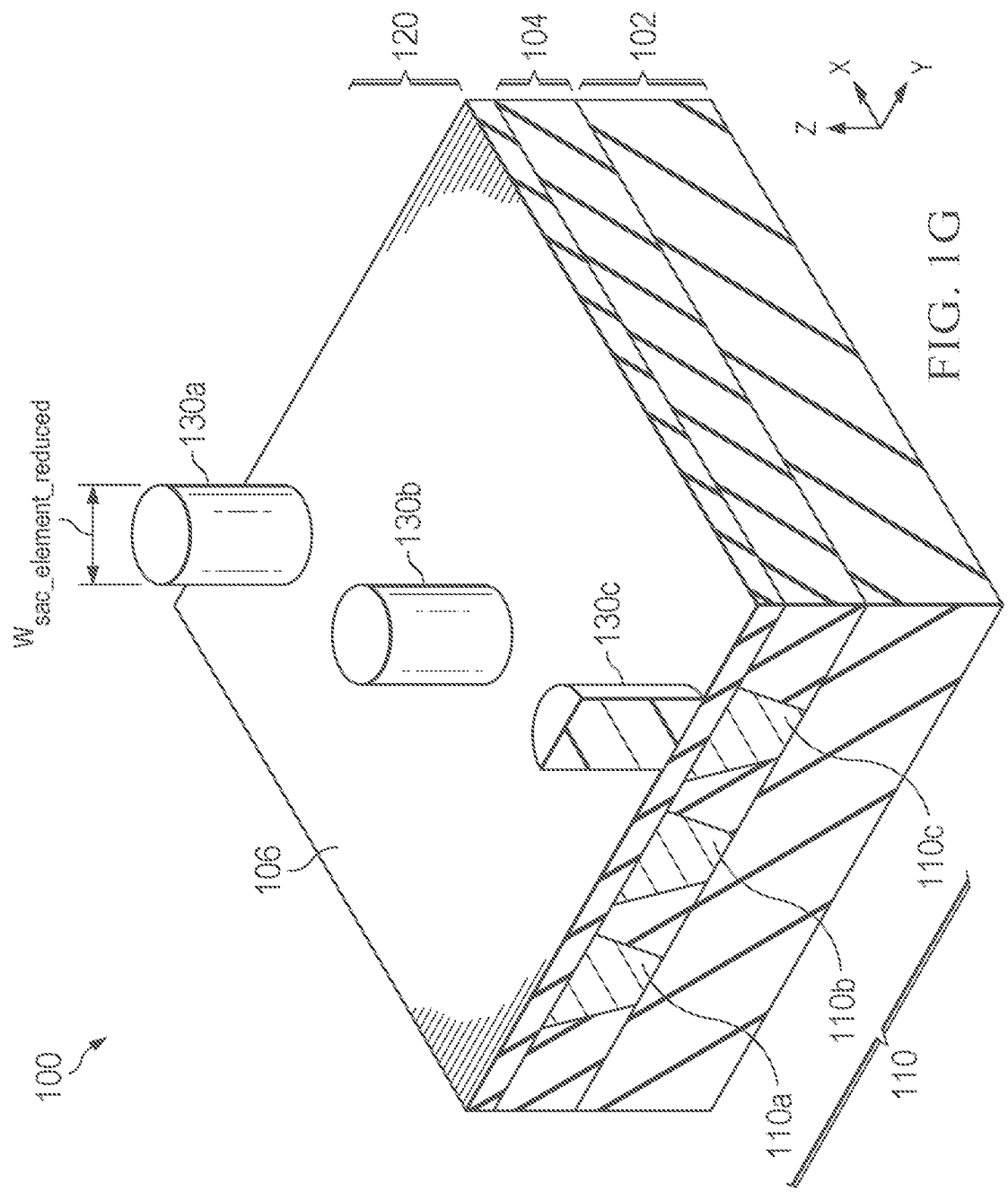
Figure 1H:
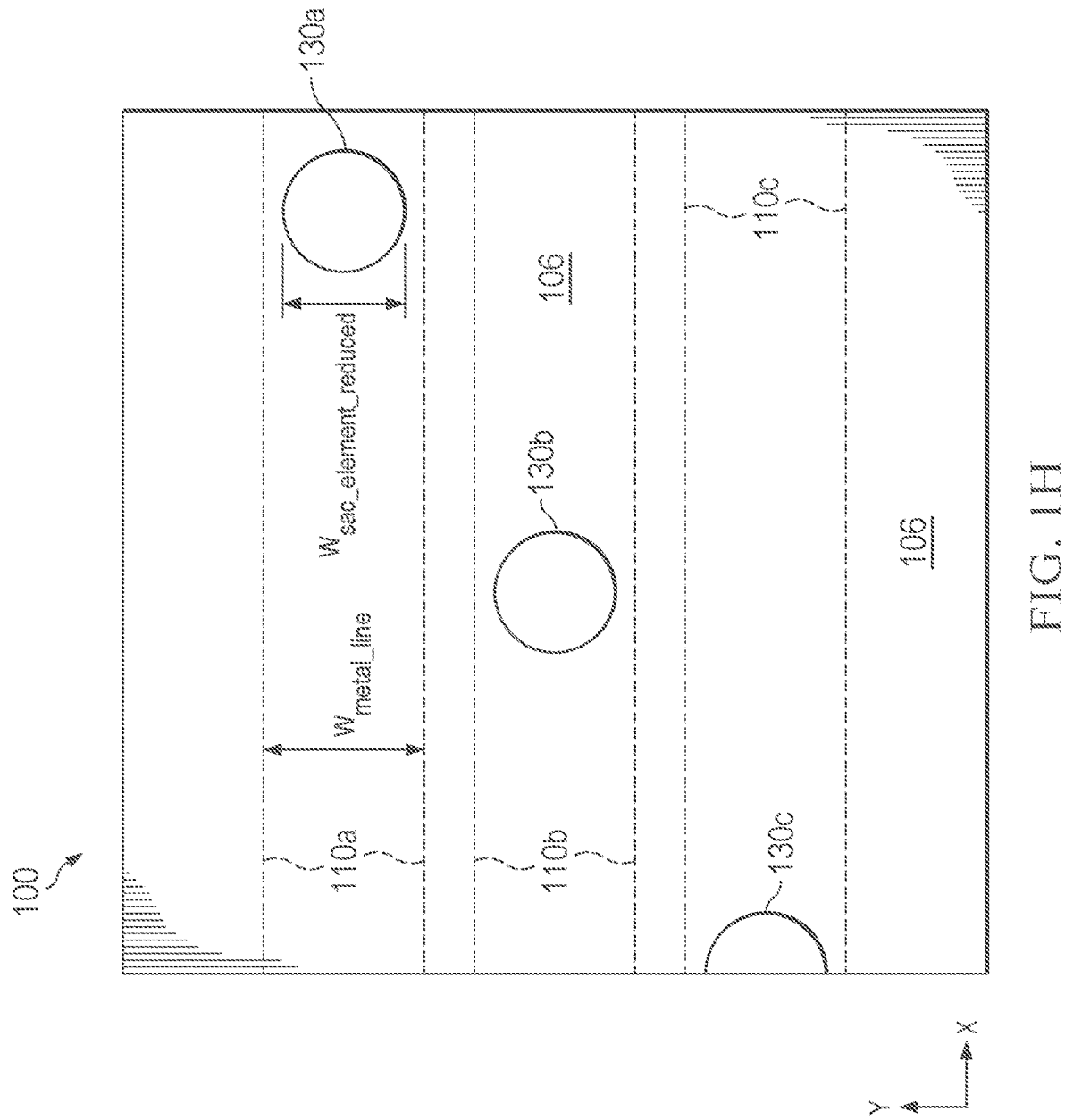
Figure 11:
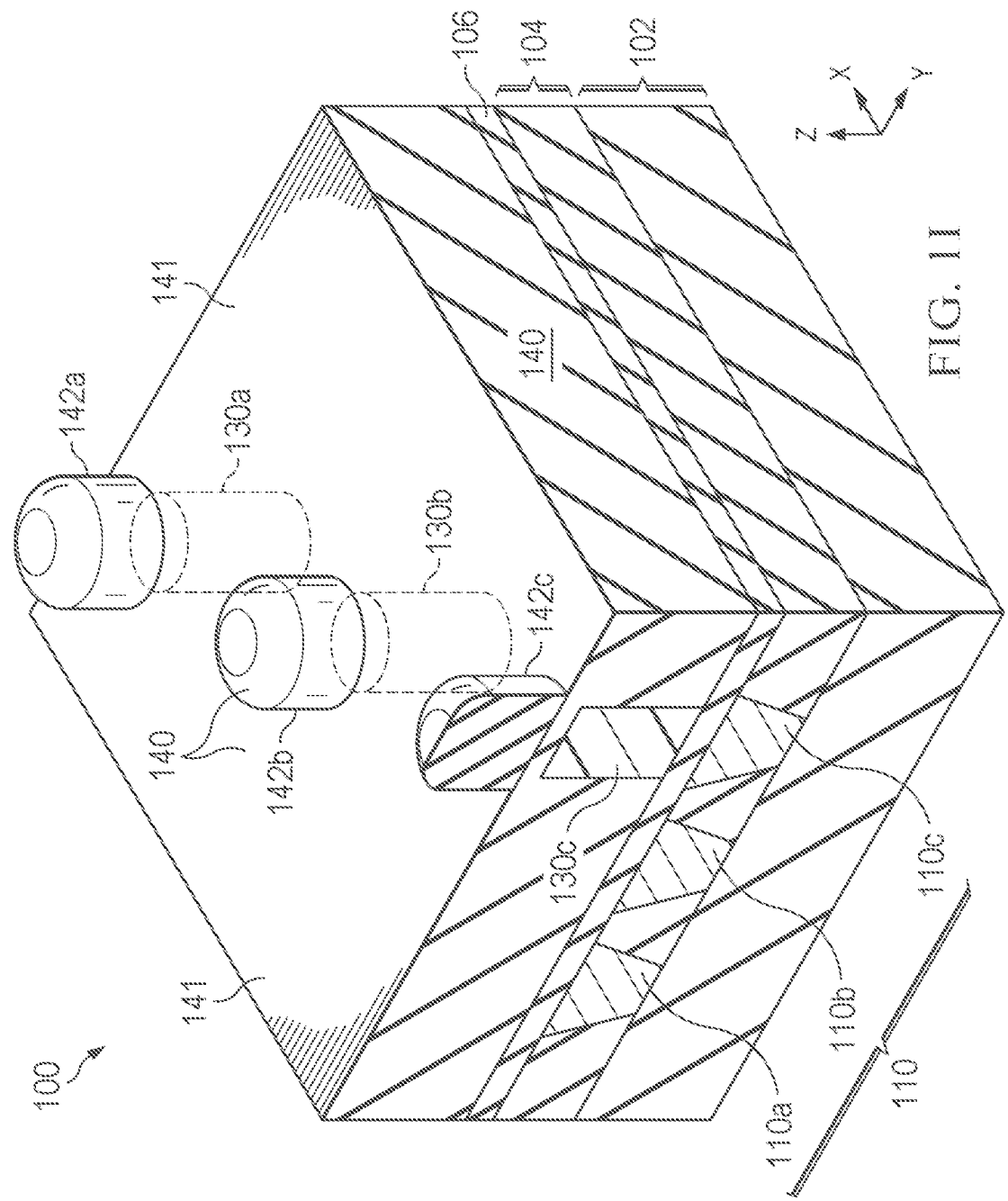
Figure 1J:
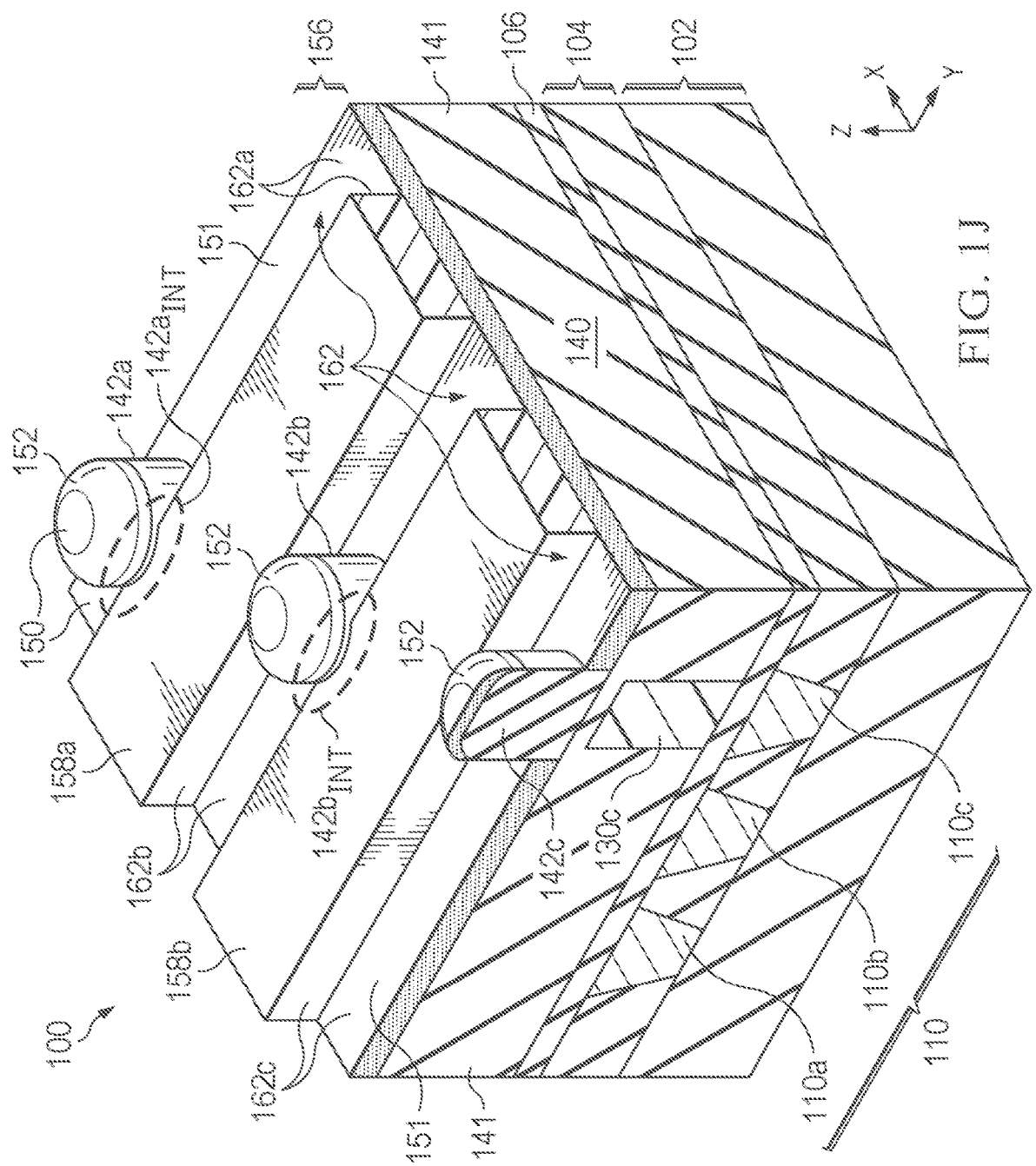
Figure 1L:
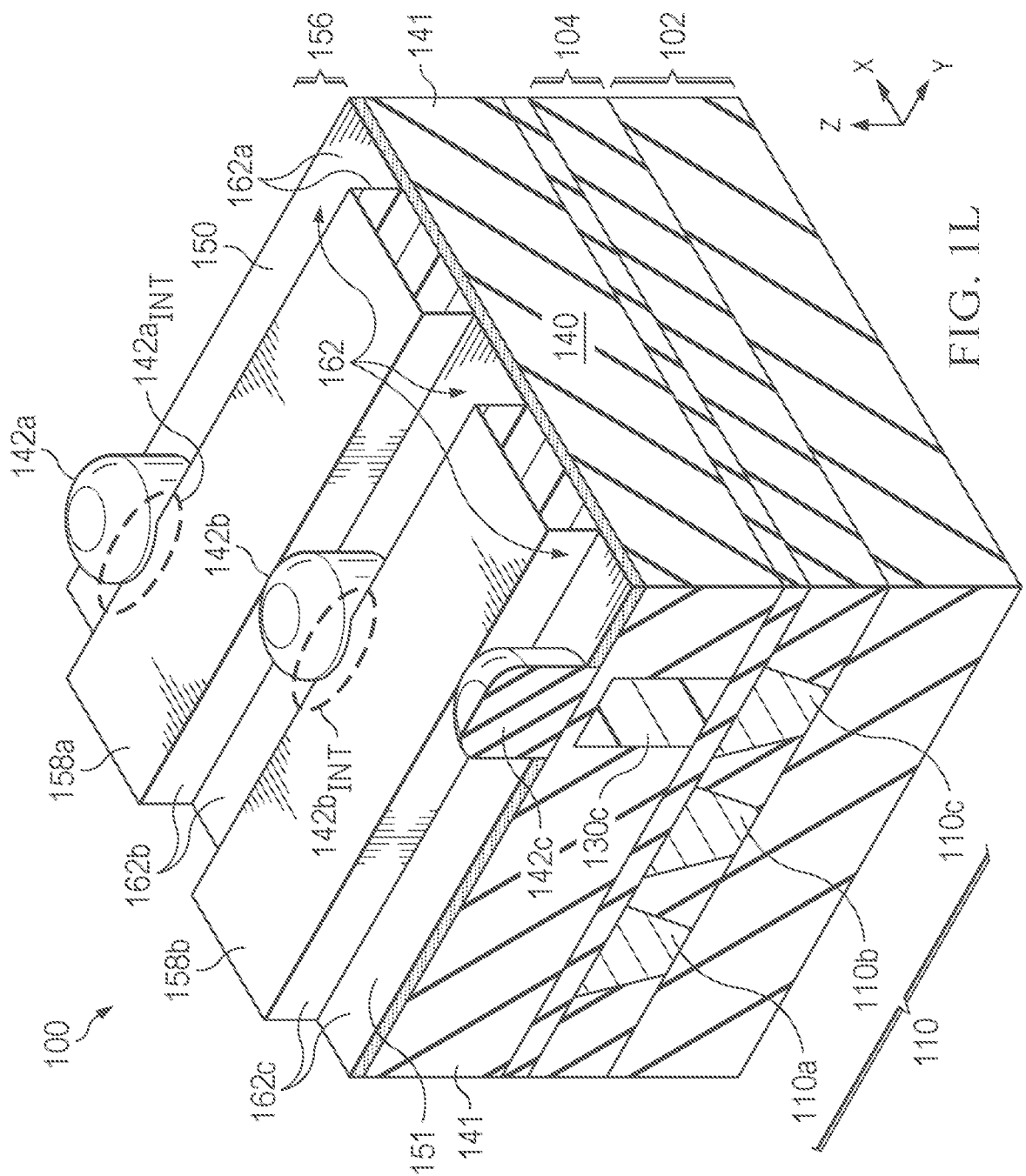
Figure 1M:
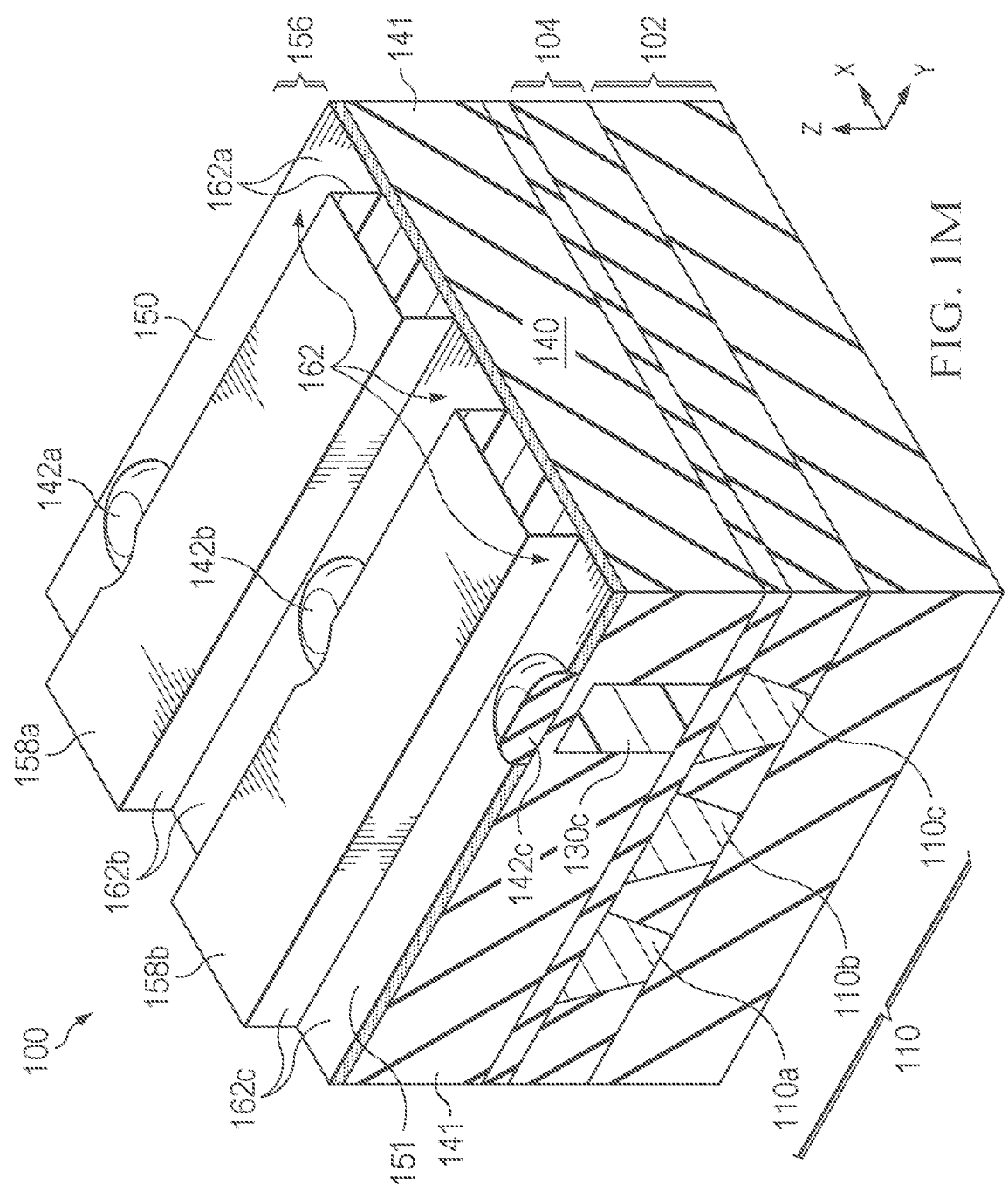
Figure 1N:
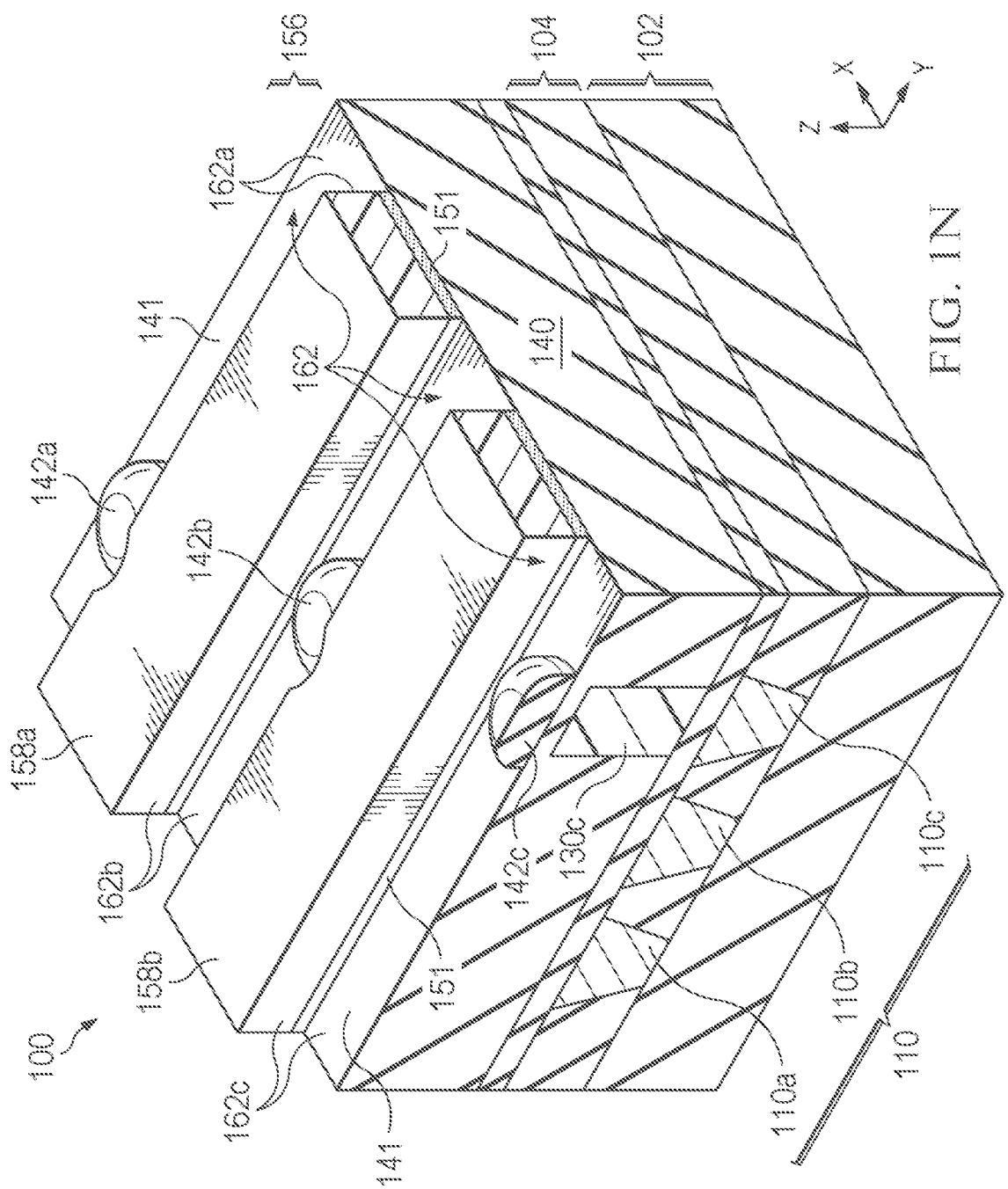
Figure 10:
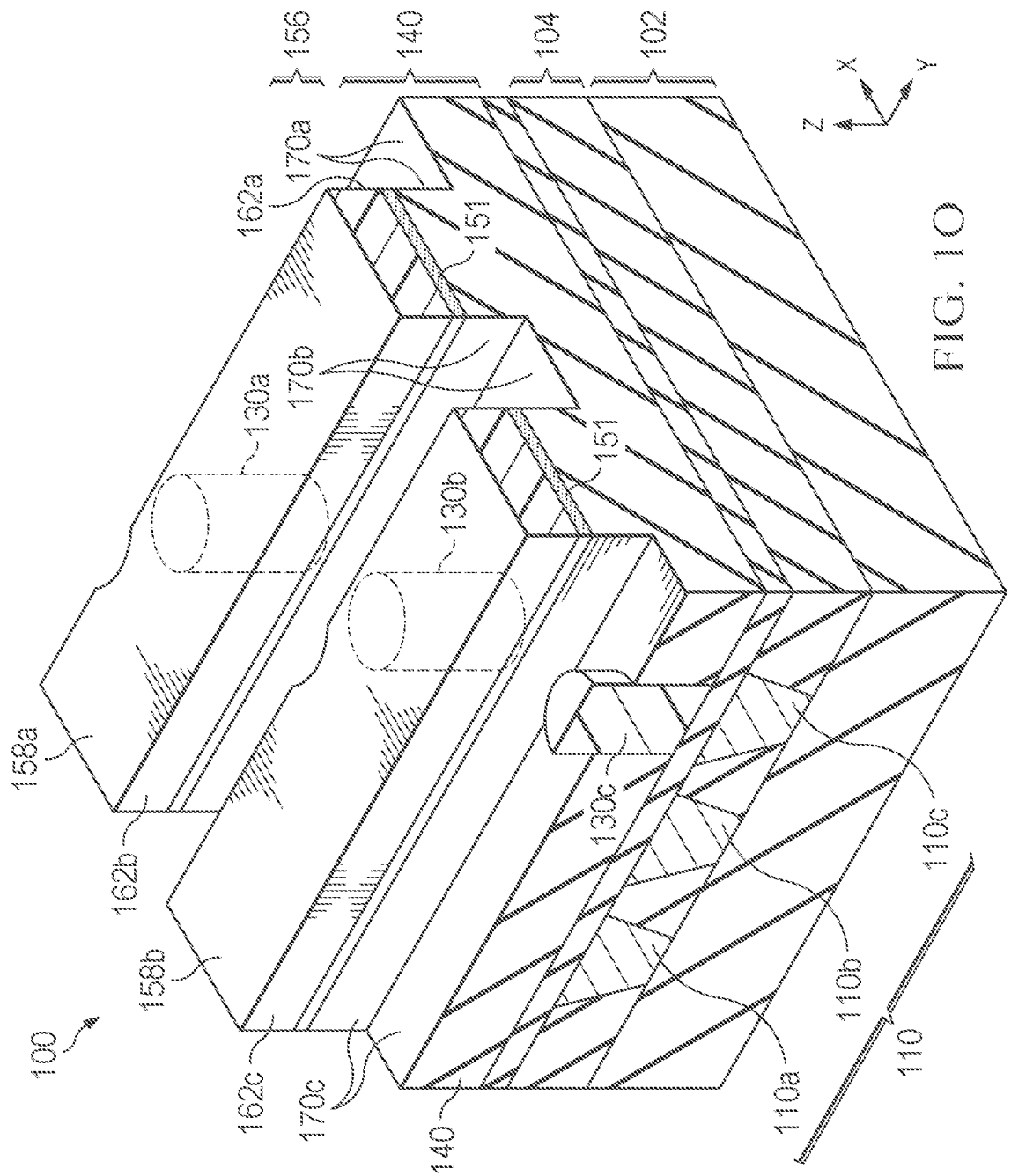
Figure 1P:
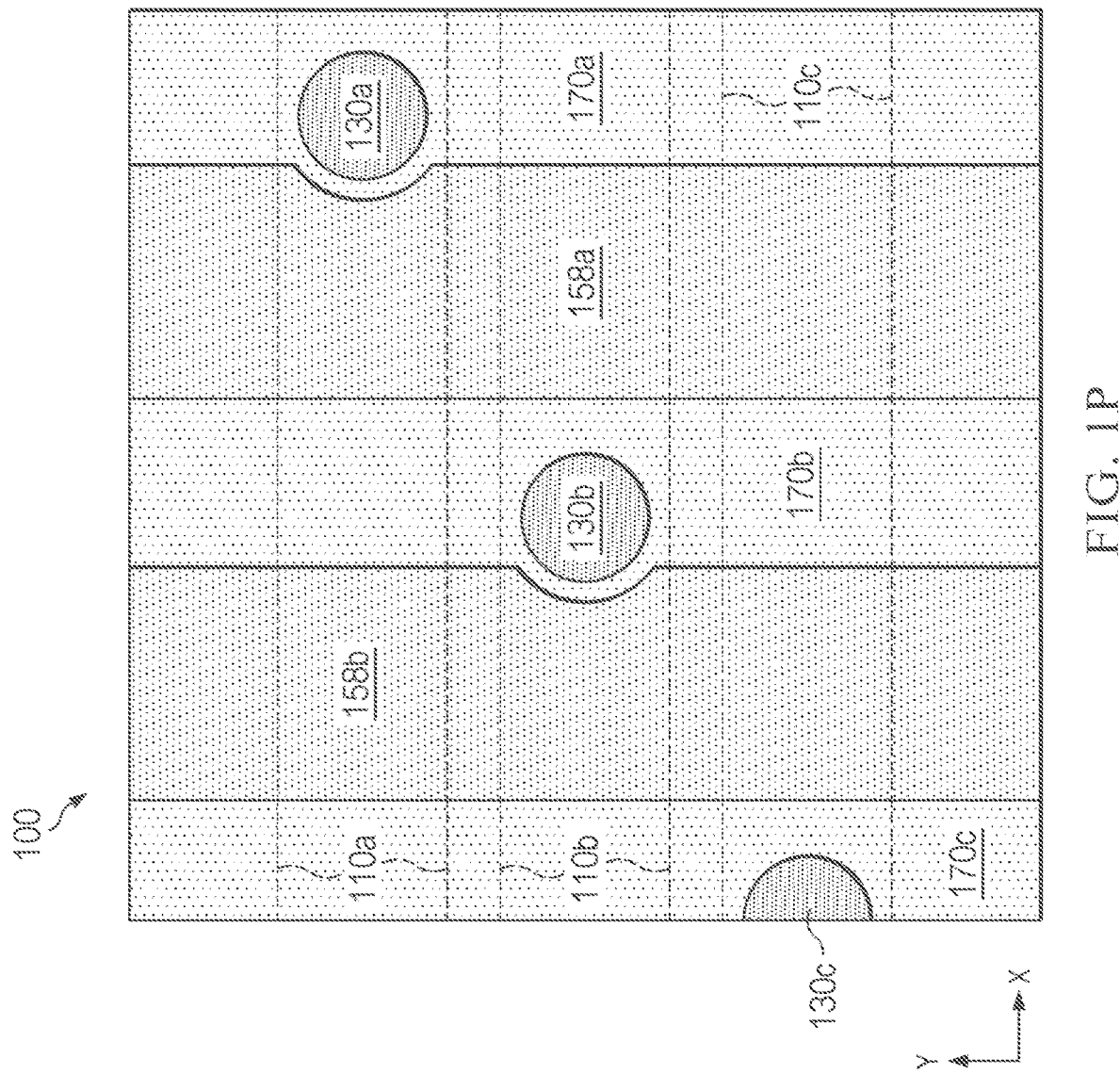
Figure 1Q:
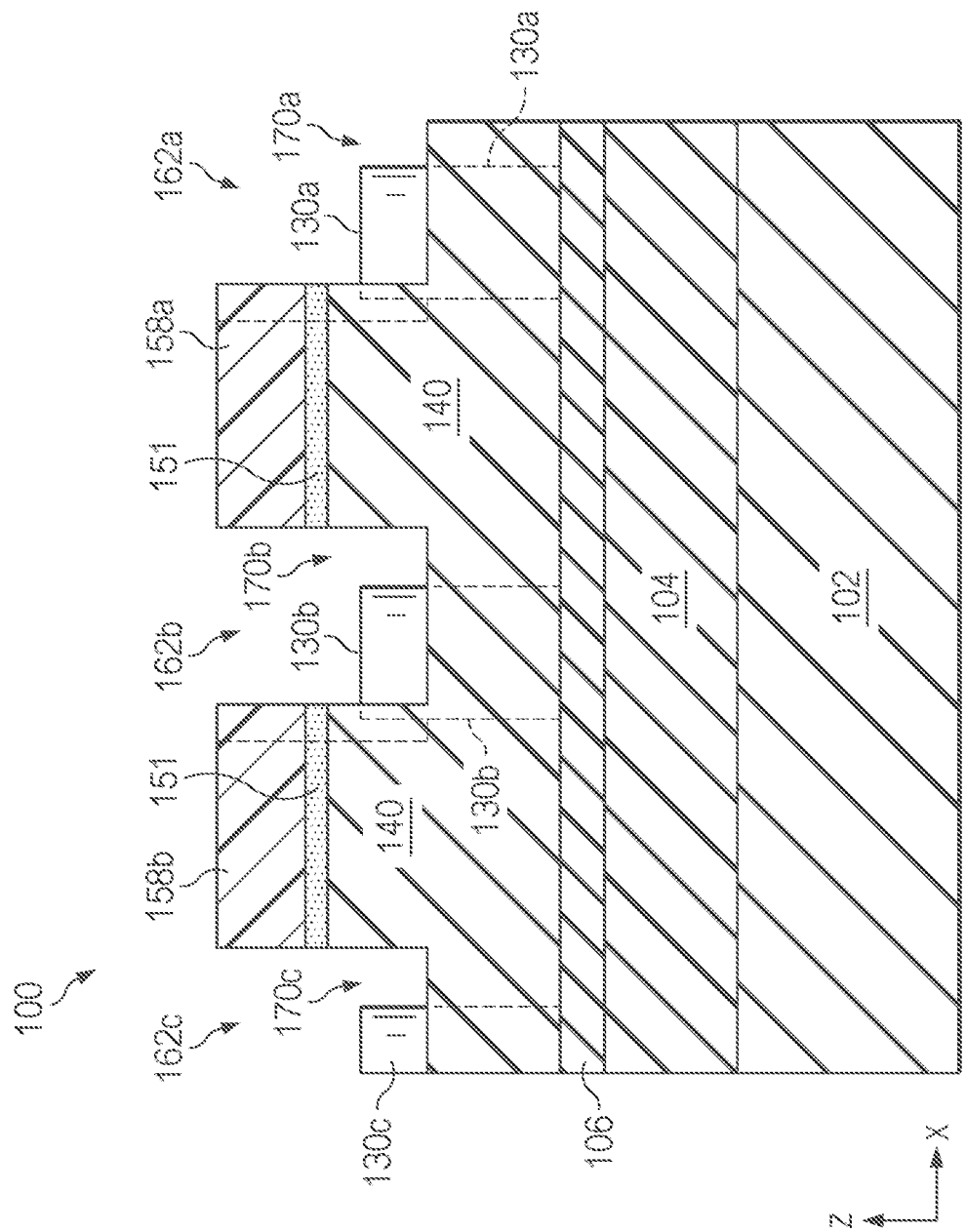
Figure 1R:
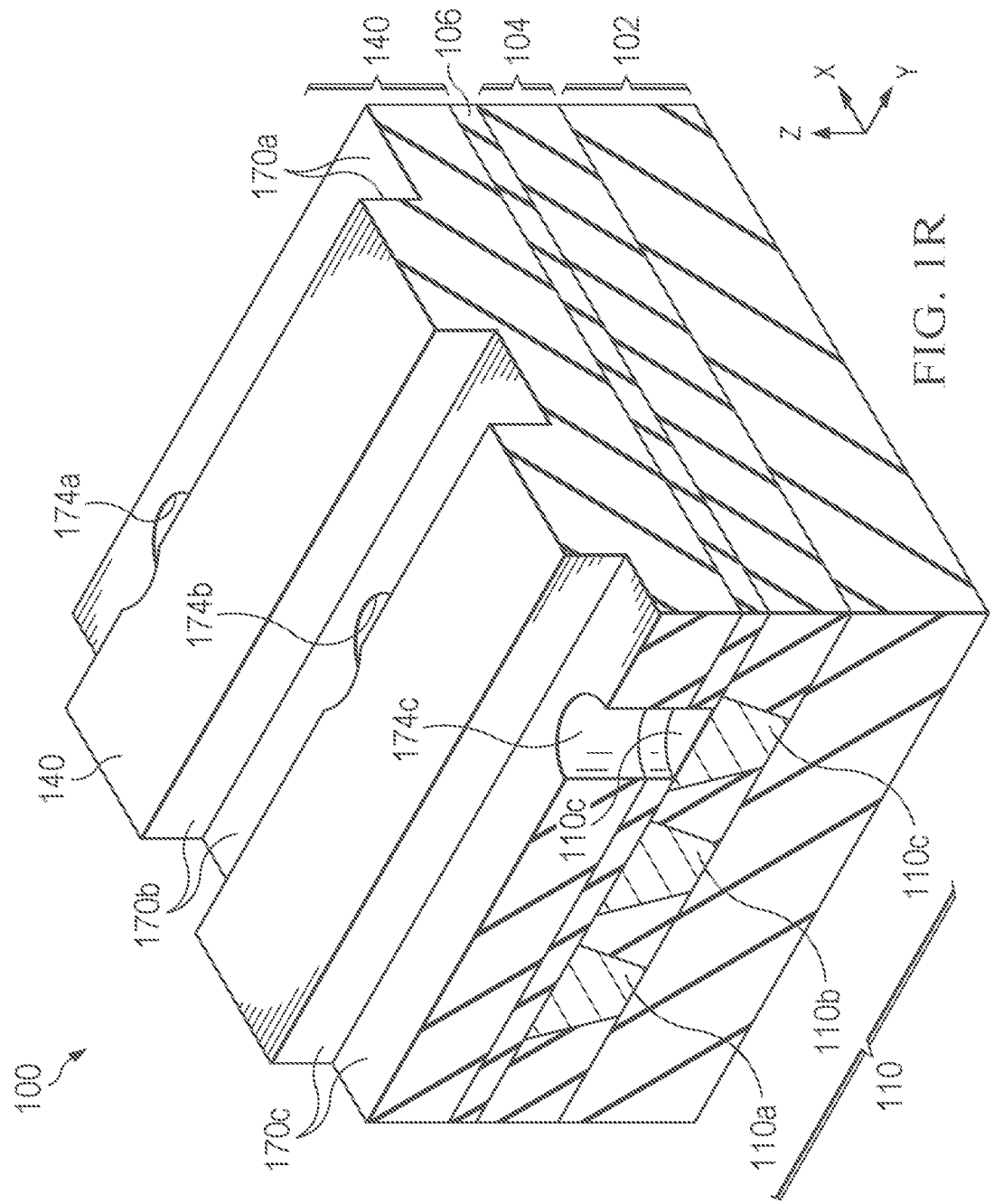
Figure 1S:
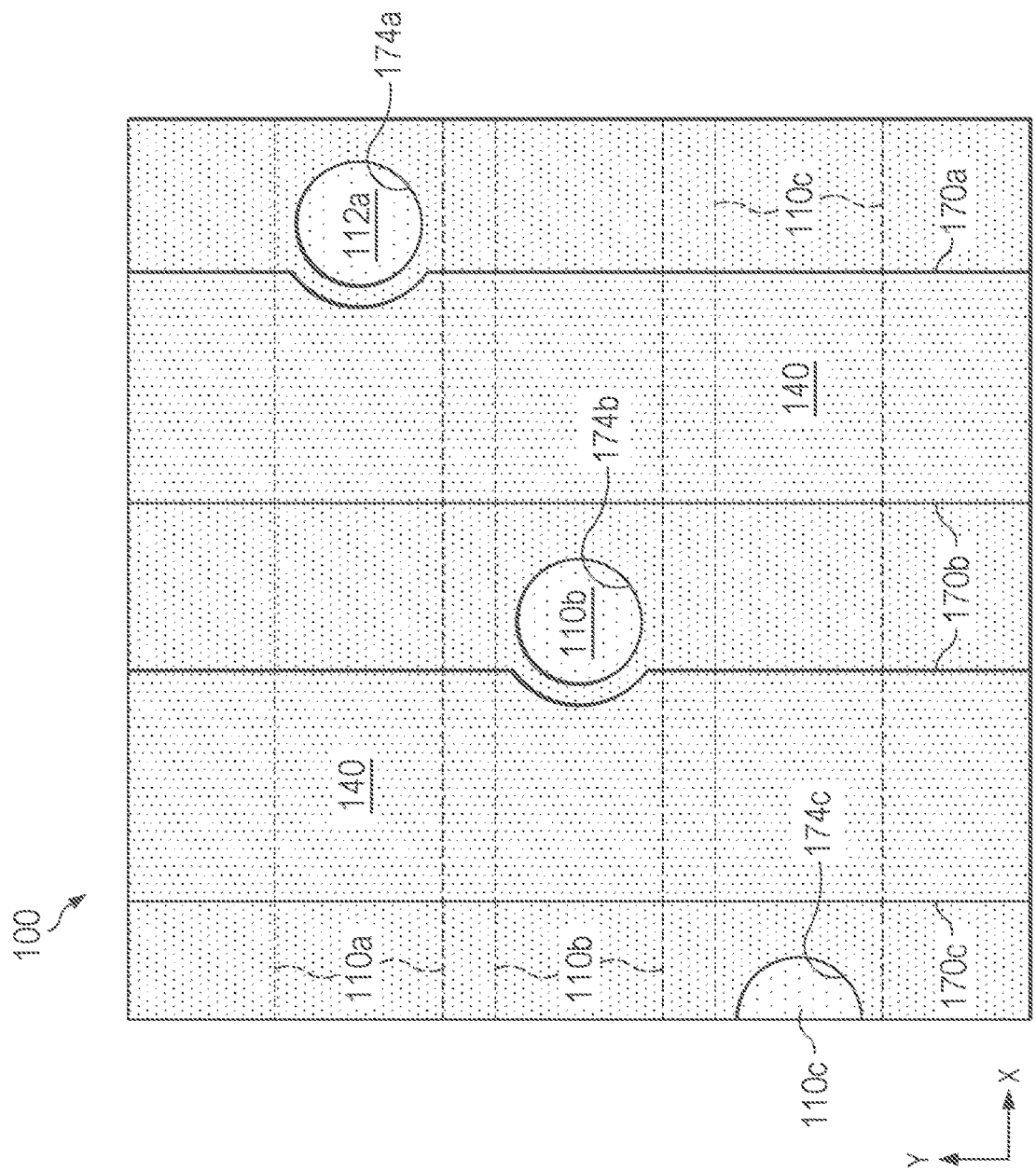
Figure 1T:
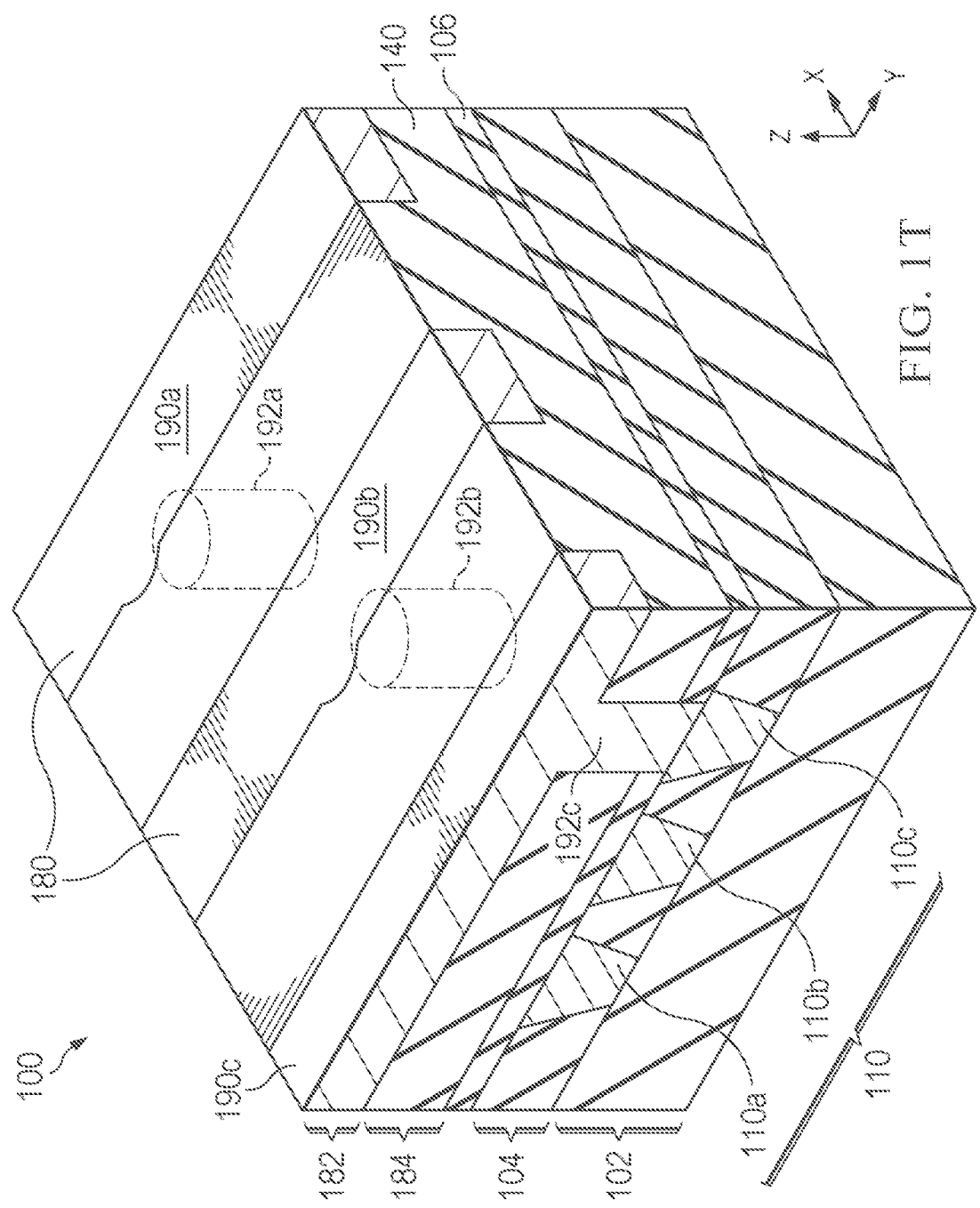
Figure 1U:
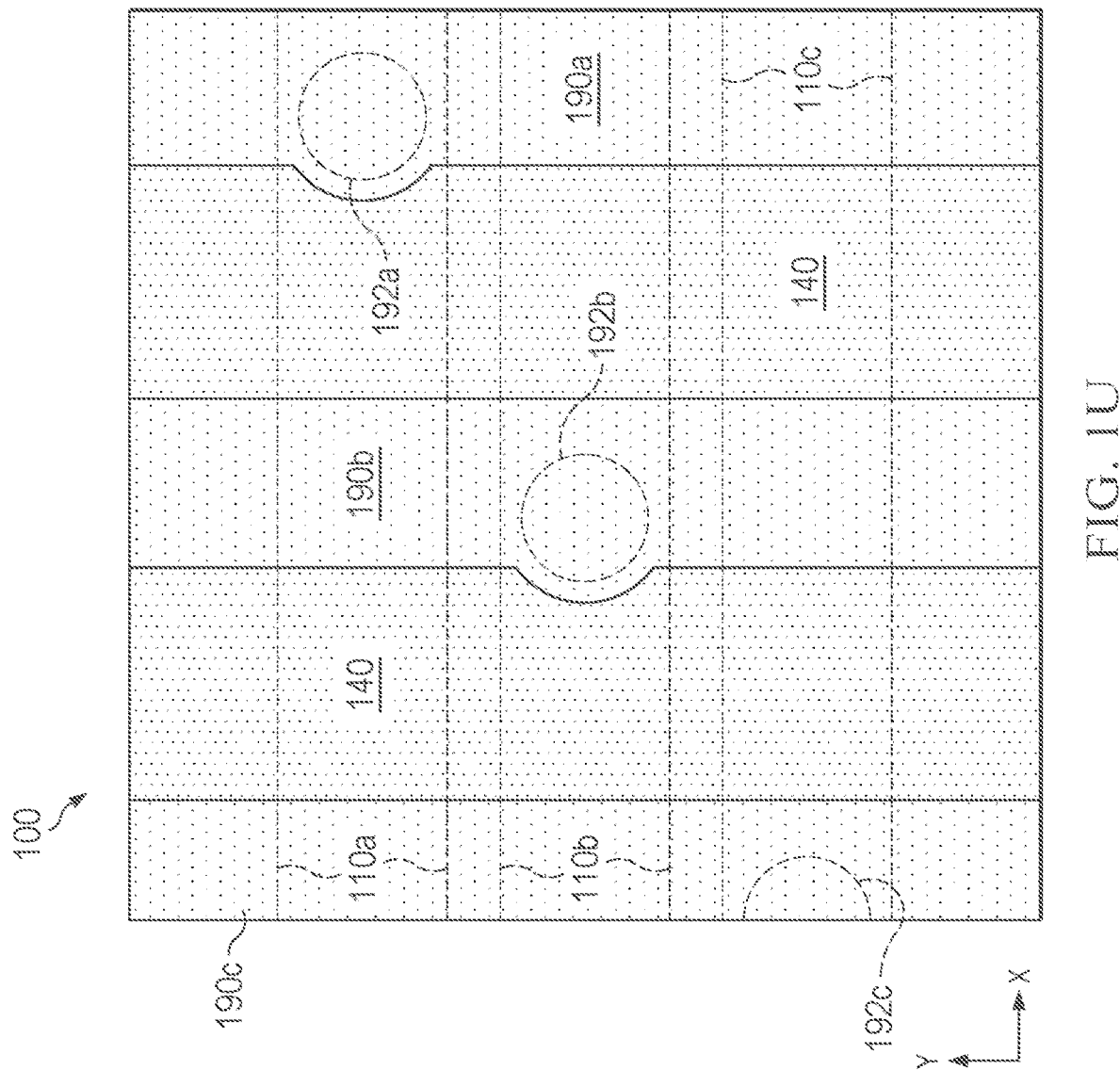

FIGS. 1A-1U show an example process for forming an integrated circuit (IC) structure 100 including vias connecting different metal layers, according to one example. In this example the vias comprise interconnect vias providing electrical connections between adjacent metal interconnect layers. In other examples the vias may comprise other vertically-extending conductive elements for electrically connecting metal elements formed in different layers or at different depths in an IC structure.

FIG. 1A is a three-dimensional isometric view of an IC structure 100 under construction. The IC structure 100 includes a lower metal layer 104 formed above a lower dielectric region 102, and an etch stop layer 106 deposited over the lower metal layer 104. In some examples, the lower dielectric region 102 may be a poly-metal dielectric region (PMD) or an inter-metal dielectric region (IMD), and may comprise silicon oxide, PSG (phosphosilicate glass), fluorinated silicate glass (FSG), organosilicate glass (OSG), or porous OSG, or a combination thereof. The lower metal layer 104 may comprise a metal interconnect layer $M_x$ formed at any depth in the IC structure 100.

For example, the lower dielectric region 102 may be a PMD formed over an active region including transistors and/or other active IC devices, and the lower metal layer 104 may comprise a first metal interconnect layer $M_1$, also referred to as Metal-1. As another example, the lower dielectric region 102 may be an IMD formed between two metal interconnect layers, in particular the lower metal layer 104 ($M_x$) and an underlying metal layer (not shown)

The lower metal layer 104 may include lower metal elements 110 formed in a dielectric region 112. The lower metal elements 110 may comprise metal lines or other metal interconnect elements, for example. In the illustrated example, the lower metal elements 110 comprise three metal lines (or wires) 110a, 110b, and 110c extending parallel to each other in the x-direction. The lower metal elements 110 may be formed in any suitable manner, e.g., by a damascene process or by a metal deposition and etch process, and may be formed from any suitable metal, e.g., copper or aluminum. Dielectric region 112 may comprise an oxide or other dielectric material.

The etch stop layer 106 may comprise nitride, polysilicon, silicon oxynitride (SiON), amorphous carbon (a-C), or other suitable etch stop material.

As shown in FIG. 1B, a sacrificial material layer 120 is deposited or otherwise formed over the etch stop layer 106. The sacrificial material layer 120 may comprise a material with etch selectivity against a subsequently formed dielectric region 140 (e.g., an oxide) (shown in FIG. 1I discussed below). In some examples the sacrificial material layer 120 may comprise polyimide (PI), nitride, polysilicon, or aluminum, and may be deposited with a thickness in range of 100-500 nm.

Next, as shown in FIG. 1C, a first photoresist layer 124 is deposited or otherwise formed over the sacrificial material layer 120. In some examples the first photoresist layer 124 comprises a positive polarity resist material, i.e. the portion of the photoresist that is exposed to light becomes soluble to the photoresist developer and the unexposed portion of the photoresist remains insoluble to the photoresist developer, which is subsequently processed using a bright field photomask, as discussed below regarding FIG. 1D. In some examples the first photoresist layer 124 may comprise a negative polarity resist material, i.e. the portion of the photoresist that is exposed to light becomes insoluble to the photoresist developer and the unexposed portion of the photoresist remains soluble to the photoresist developer.

Next, as shown in FIG. 1D (three-dimensional isometric view) and FIG. 1E (top view), the first photoresist layer 124 is patterned to define photomask elements 125a-125c. As shown in FIG. 1E, photomask elements 125a-125c may be aligned (e.g., in the y-direction) with metal lines 110a, 110b, and 110c, respectively. Photomask elements 125a-125c may have any suitable shape for subsequently forming vias connected to metal lines 110a, 110b, and 110c, as discussed below. For example, respective photomask elements 125a-125c may have a cylindrical (or "pillar") shape, or other vertically-extending prism shape.

In some examples, the first photoresist layer 124 is patterned using a bright field (also referred to as "clear field" or "light field") patterning technique. For example, a photomask 126, which may be a bright field photomask, including mask regions or "islands" 128 may be used with the first photoresist layer 124 comprising a positive polarity resist material to form photomask elements 125a-125c, by selectively removing photomask material outside the perimeter of islands 128 so as to leave respective photomask elements 125a-125c. In some examples using a bright field photomask may provide increased photo contrast as compared with a dark field photomask, which may be advantageous for effectively producing photomask elements 125a-125c.

In some examples photomask elements 125a-125c may be formed with a minimal critical dimension, e.g., a diameter or lateral width $W_{mask\_element}$, based on the relevant equipment and/or process involved. For example, in some implementations in which a krypton fluoride laser (KrF laser), having a 248 nm wavelength, is used to process first photoresist layer 124, photomask elements 125a-125c may be formed with a critical dimension (e.g., $W_{mask\_element}$) in the range of 130-200 nm (e.g., about 140 nm). As another example, in some implementations in which an argon fluoride laser (ArF laser), having a 193 nm wavelength, is used to process first photoresist layer 124, photomask elements 125a-125c may be formed with a critical dimension (e.g., $W_{mask\_element}$) in the range of 100-150 nm (e.g., about 110 nm). In some examples a photoresist trimming process, e.g., including a dry plasma etch or other photoresist trim etch, may be performed to further reduce width $W_{mask\_element}$ or other critical dimension of photomask elements 125a-125c.

As shown in FIG. 1F, an etch (e.g., plasma etch) is performed to selectively etch portions of the sacrificial material layer 120 not covered by the photomask elements 125a-125c, thereby forming corresponding sacrificial elements 130a-130c having corresponding shapes as respective photomask elements 125a-125c. For example, respective sacrificial elements 130a-130c may have a cylindrical (or "pillar") shape, or other vertically-extending prism shape. Remaining portions of the photomask elements 125a-125c above the sacrificial elements 130a-130c are removed after the etch.

As discussed below, sacrificial elements 130a-130c may be used for subsequently forming corresponding vias 192a-192c connected between metal lines 110a-110c and overlying metal elements 190a-190c (shown in FIGS. 1T and 1U, discussed below). In some examples a target or desired size of respective vias 192a-192c may be smaller than respective sacrificial elements 130a-130c in at least one dimension. For example, a target dimension of respective via 192a in at least one lateral direction (e.g., in the x-direction or y-direction), e.g., as specified in a relevant process specification for the IC structure 100, may be smaller than the corresponding dimension of the sacrificial element 130a, e.g., due to dimensional limitations or process limitations associated with the formation of the photomask elements 125a-125c and/or the sacrificial elements 130a-130c.

As shown in FIG. 1F, respective sacrificial elements 130a-130c have a respective diameter or lateral width, $W_{sac\_element}$, in at least one lateral direction (e.g., x-direction and/or y-direction). In some examples the lateral width $W_{sac\_element}$ of respective sacrificial elements 130a-130c may be a smallest width that can be reliably formed using the relevant photolithographic processes discussed above, e.g., based on process and/or equipment-related constraints. For example, in an example in which a KrF laser is used to form photomask elements 125a-125c with a $W_{mask\_element}$ in the range of 130-200 nm (as discussed above), the etched sacrificial elements 130a-130c may have a similar or smaller width $W_{sac\_element}$ in the range of 110-150 nm. As another example, in an example in which an ArF laser is used to form photomask elements 125a-125c with a $W_{mask\_element}$ in the range of 100-150 nm (as discussed above), the etched sacrificial elements 130a-130c may have a similar or smaller width $W_{sac\_element}$ in the range of 80-120 nm.

In some examples an optional reduction step or process is performed to reduce the lateral width $W_{sac\_element}$ of respective sacrificial elements 130a-130c, e.g., to provide target or desired size of subsequently formed vias 192a-192c, as discussed above. For example, the sacrificial elements 130a-130c may be etched, e.g., using an over-etch or etch-back process (e.g., an isotropic etch), to reduce the lateral width $W_{sac\_element}$ of respective sacrificial elements 130a-130c in at least one lateral direction. In addition, the etch may remove unwanted physical irregularities (e.g., spurs or other protrusions) in respective sacrificial elements 130a-130c that may result from photolithographic pattern transfer shown in FIGS. 1D-1E.

FIG. 1G (three-dimensional isometric view) and FIG. 1H (top view) show the sacrificial elements 130a-130c having a reduced diameter or lateral width, $W_{sac\_element\_reduced}$ resulting from such etch process. The reduced width $W_{sac\_element}$ reduced of sacrificial elements 130a-130c may correspond with a target or desired size of subsequently formed vias 192a-192c. For example, in an example in which a KrF laser is used to form photomask elements 125a-125c with a $W_{mask\_element}$ in the range of 130-200 nm, which are used to form etched sacrificial elements 130a-130c having width $W_{sac\_element}$ in the range of 110-150 nm (as discussed above), the optional reduction process reduced may provide a reduced width $W_{sac\_element}$ reduced in the range of 40-100 nm, for subsequent formation of) vias 192a-192c having a width of 40-100 nm. As another example, in an example in which an ArF laser is used to form photomask elements 125a-125c with a $W_{mask\_element}$ in the range of 100-150 nm, which are used to form etched sacrificial elements 130a-130c having width $W_{sac\_element}$ in the range of 90-120 nm (as discussed above), the optional reduction process reduced may provide a reduced width $W_{sac\_element}$ reduced in the range of 30-90 nm, for subsequent formation of) vias 192a-192c having a width of 30-90 nm In some examples, e.g., as shown in FIG. 1H, the reduced width $W_{sac\_element}$ reduced of respective sacrificial elements 130a-130c may be located within a width $W_{metal\_line}$ of a respective underlying lower metal element 110a-110c, so that respective sacrificial elements 130a-130c do not laterally overhang the underlying lower metal element 110a-110c, respectively.

As shown in FIG. 1I, a dielectric region 140 is deposited or otherwise formed over the etch stop layer 106 and sacrificial elements 130a-130c. The deposited dielectric region 140 comprises a laterally-extending layer portion 141 and dielectric element projections 142a-142c covering and extending upwardly above respective sacrificial elements 130a-130c. As shown, the deposited dielectric region 140 may encapsulate respective sacrificial elements 130a-130c. The dielectric region 140 may comprise an inter-metal dielectric (IMD) region, e.g., comprising oxide or Spin-on Dielectrics (SOD), e.g., comprising organosilica. In some examples, the dielectric region 140 may be deposited by a high-temperature deposition process (e.g., in the range of 350-400° C.); in such examples the sacrificial material layer 120 may comprise a material resistant to such high-temperature processing, for example polysilicon or silicon nitride (SiN).

As shown in FIG. 1J (three-dimensional isometric view) and FIG. 1K (top view), an optional anti-reflective coating 150 may be deposited or otherwise formed over the dielectric region 140, and may include (a) a base layer portion 151 formed on the laterally-extending layer portion 141 of the dielectric region 140 and (b) respective cap portions 152 covering an upper portion of respective dielectric element projections 142a-142c. A vertical thickness of the cap portions 152 may be smaller than a vertically thickness of the base layer portion 151, as an inherent result of the deposition process of the anti-reflective coating 150. In some examples the optional anti-reflective coating 150, having the cap portions 152 with a smaller thickness than the base layer portion 151, may be used for selectively removing or reducing the dielectric element projections 142a-142c after formation of a patterned photomask 156, as discussed below.

In some examples the anti-reflective coating 150 may comprise:

(a) a bottom anti-reflective coating (BARC), for example formed from an organic polymer (e.g., a deep ultraviolet (DUV) anti-reflective coating product such as one from Brewer Science located at 2401 Brewer Drive, Rolla, MO (e.g., DUV 42P or DUV 96 product)) or other BARC material, or (b) a dielectric anti-reflective coating (DARC) layer, for example a spin-on or deposited amorphous carbon hard mask, or (c) other suitable anti-reflective coating material.

As shown in FIGS. 1J and 1K, a second photoresist layer 156 is then deposited or otherwise formed over the anti-reflective coating 150 (or directly on the dielectric region 140 in an example in which the optional anti-reflective coating 150 is omitted). The second photoresist layer 156 may be patterned (e.g., using any suitable photolithographic process) to define second photoresist openings 162 defined between remaining second photoresist regions 158. In the illustrated example, second photoresist openings 162 include photoresist trench openings 162a, 162b and 162c spaced apart by remaining second photoresist regions 158a and 158b.

As shown in FIG. 1J, the dielectric element projections 142a-142c may extend above a top surface of the second photoresist layer 156. Thus, respective thicknesses (in the z-direction) of the sacrificial material layer 120, the dielectric region 140, and the second photoresist layer 156 may be selected such that the dielectric element projections 142a-142c extend above the top surface of the second photoresist layer 156.

As discussed below, photoresist trench openings 162a-162c may be used for subsequently forming upper metal elements 190a-190c, and dielectric element projections 142a-142c may be used for subsequently forming vias 192a-192c extending downwardly from respective upper metal elements 190a-190c. Thus, the respective location of photoresist trench openings 162a-162c may be selected for alignment with respective dielectric element projections 142a-142c. However, in some instances the photoresist trench openings 162a, 162b and 162c may be laterally misaligned with respective dielectric element projections 142a-142c and/or with respective sacrificial elements 130a-130c underlying the dielectric element projections 142a-142c, resulting in areas of interference between the dielectric element projections 142a-142c and respective remaining second photoresist regions 158.

As shown in FIGS. 1J and 1K, the photoresist trench opening 162a is laterally misaligned in the x-direction with the dielectric element projection 142a, resulting in an interference area $142a_{int}$ between the dielectric element projection 142a and the remaining second photoresist region 158a. In addition, as shown in FIG. 1K, the photoresist trench opening 162a is also misaligned with the underlying sacrificial element 130a, resulting in an interference area $130a_{int}$ between the sacrificial element 130a and second photoresist region 158a.

Similarly, the photoresist trench opening 162b is laterally misaligned in the x-direction with both the dielectric element projection 142b, resulting in interference area $142b_{int}$ between the dielectric element projection 142b and the remaining second photoresist region 158b (shown in FIGS. 1J and 1K), and the underlying sacrificial element 130b, resulting in an interference area $130b_{int}$ between the sacrificial element 130b and second photoresist region 158b (shown in FIG. 1K).

Because the dielectric element projections 142a and 142b extend above the top surface of the second photoresist layer 156, the interference areas $142a_{int}$ and $142b_{int}$ extend vertically through a full vertical thickness of the second photoresist layer 156. The deposited second photoresist 156 are excluded from interference areas $142a_{int}$ and $142b_{int}$, which allows the subsequently formed vias 192a-192c to be formed with a full diameter or full width, as shown in subsequent FIGS. 1L-1U discussed below, e.g., in contrast with partial vias resulting from misalignments in a conventional process as discussed above in the Background section.

As shown in FIG. 1L, the cap portions 152 of the anti-reflective coating 150 covering the upper portions of respective dielectric element projections 142a-142c may be removed, while maintaining at least a partial thickness of the base layer portion 151 of the anti-reflective coating 150, based on the smaller thickness of the cap portions 152 as compared with the base layer portion 151, as discussed above. In some examples the cap portions 152 may be removed by an ash (oxide etch) process or using a physical argon-based process.

As shown in FIG. 1M, a full or partial height of the dielectric element projections 142a-142c may be removed. For example, an etch selective to the dielectric element projections 142a-142c may be performed to remove a full or partial height of the dielectric element projections 142a-142c without removing the remaining second photoresist regions 158 or the remaining anti-reflective coating 150.

As shown in FIG. 1N, exposed portions of the remaining anti-reflective coating 150 (i.e., portions of the remaining base layer portion 151 that are not covered by remaining second photoresist regions 158) may be removed, e.g., using a dry etch or other suitable removal process, thereby exposing top surface areas of the underlying dielectric region 140.

As shown in FIG. 1O (three-dimensional isometric view), FIG. 1P (top view), and FIG. 1P (side view), an anisotropic trench etch is performed through the photoresist trench openings 162a, 162b and 162c and through a partial depth of the dielectric region 140 to form respective dielectric region trench openings 170a, 170b and 170c (for forming upper metal elements as discussed below regarding FIGS. 1T and 1U), and to partially expose the sacrificial elements 130a-130c. As shown in FIGS. 1P and 1Q, as a result of the photoresist regions 158a and 158b being misaligned in the x-direction with the respective sacrificial elements 130a-130c, the etched dielectric region trench openings 170a, 170b and 170c are similarly misaligned with the sacrificial elements 130a-130c.

The anisotropic trench etch may be selective to the material of the sacrificial elements 130a-130c (e.g., polyimide, nitride, polysilicon, or aluminum), so that the sacrificial elements 130a-130c is etched more slowly than the surrounding dielectric region 140. In some examples the anisotropic trench etch may remove a partial vertical height of the sacrificial elements 130a-130c, but leave the area (in the x-y plane) of the sacrificial elements 130a-130c fully or substantially intact. As shown in FIG. 1P, as a result of the dielectric element projections 142a and 142b excluding the second photoresist 156 (e.g., second photoresist regions 158a and 158b) from extending over the sacrificial elements 130a-130c (as discussed above regarding FIGS. 1J and 1K), the full area (in the x-y plane) of the respective sacrificial elements 130a-130c may be exposed by the trench etch.

As shown in FIG. 1R (three-dimensional isometric view) and FIG. 1S (top view), remaining sacrificial elements 130a-130c, second photoresist regions 158, and anti-reflective coating 150 are removed, either by a single process or multiple processes, which thereby defines via openings 174a, 174b, and 174c in the first dielectric region 140 at the respective locations of the removed sacrificial elements 130a-130c.

In a first example in which the sacrificial elements 130a-130c are formed from polyimide, the sacrificial elements 130a-130c, second photoresist regions 158, and anti-reflective coating 150 may be removed by a single ash process. The ash process may be followed by an etch to remove regions of the etch stop layer 106 exposed through the respective via openings 174a-174c, to thereby expose underlying regions of lower metal elements 110a-110c, as shown in FIG. 1R.

In a second example in which the sacrificial elements 130a-130c are formed from nitride or other material, the second photoresist regions 158 and anti-reflective coating 150 may be removed by an ash process, followed by a selective etch (i.e., selective to the sacrificial elements 130a-130c) to remove the sacrificial elements 130a-130c but not the surrounding dielectric material of the dielectric region 140. In this second example, the etch to remove the sacrificial elements 130a-130c may also remove the etch stop layer 106 exposed through the respective via openings 174a-174c, or alternatively a separate etch may be performed to remove the exposed regions of the etch stop layer 106, to thereby expose underlying regions of lower metal elements 110a-110c, as shown in FIG. 1R.

The respective via openings 174a-174c have the full area (in the x-y plane) of the removed sacrificial elements 130a-130c. For example, as shown in FIG. 1S, the respective via openings 174a-174c have a full circular area in the x-y plane. Thus, by forming the sacrificial elements 130a-130c and the overlying dielectric element projections 142a and 142b that exclude the second photoresist 156 from extending over the sacrificial elements 130a-130c (which allows the full area (in the x-y plane) of the sacrificial elements 130a-130c to be exposed by the trench etch, as discussed above), the area (in the x-y plane) of the respective via openings 174a-174c may be defined by the geometry of photomask 126 (e.g., the geometry of mask regions or islands 128) used to define the sacrificial elements 130a-130c, and not delimited or reduced by the misaligned second photoresist regions 158a and 158b. This may provide an advantage over conventional processes in which the area (in the x-y plane) of via openings may be delimited or reduced by a misaligned trench etch photoresist, e.g., as discussed above in the Background section.

Finally, as shown in FIG. 1T (three-dimensional isometric view) and FIG. 1U (top view), the respective dielectric region trench openings 170a-170c and respective via openings 174a-174c may be filled with at least one metal to define (a) respective upper metal elements (e.g., metal lines) 190a-190c in respective dielectric region trench openings 170a-170c and (b) respective vias 192a-192c in respective via openings 174a-174c. The upper metal elements 190a-190c may define elements of an upper metal layer 182, and the vias 192a-192c may define elements of a via layer 184 between the lower metal layer 104 and upper metal layer 182.

In some examples, the upper metal elements 190a-190c and vias 192a-192c may be formed concurrently using a dual damascene process. For example, copper or other suitable metal may be deposited over the structure, flowing down into the via openings 174a-174c and filling the overlying dielectric region trench openings 170a-170c. In such an example the upper metal elements 190a-190c and vias 192a-192c may define a continuous metal structure, wherein the respective vias 192a-192c extend downwardly from respective upper metal elements 190a-190c. A planarization process, e.g., a chemical mechanical planarization (CMP), may be performed to remove excess metal (e.g., copper) outside the dielectric region trench openings 170a-170c and to planarize a top surface of the resulting structure.

Based on the above, the vias 192a-192c formed in the manner described above may have a full area in the x-y plane (e.g., a full circular area) as defined by the geometry of photomask 126 used to define the sacrificial elements 130a-130c, and not delimited or reduced by a misalignment of the second photoresist regions 158 for forming the dielectric region trench openings 170a-170c for forming the upper metal layer 182.

Figure 2:
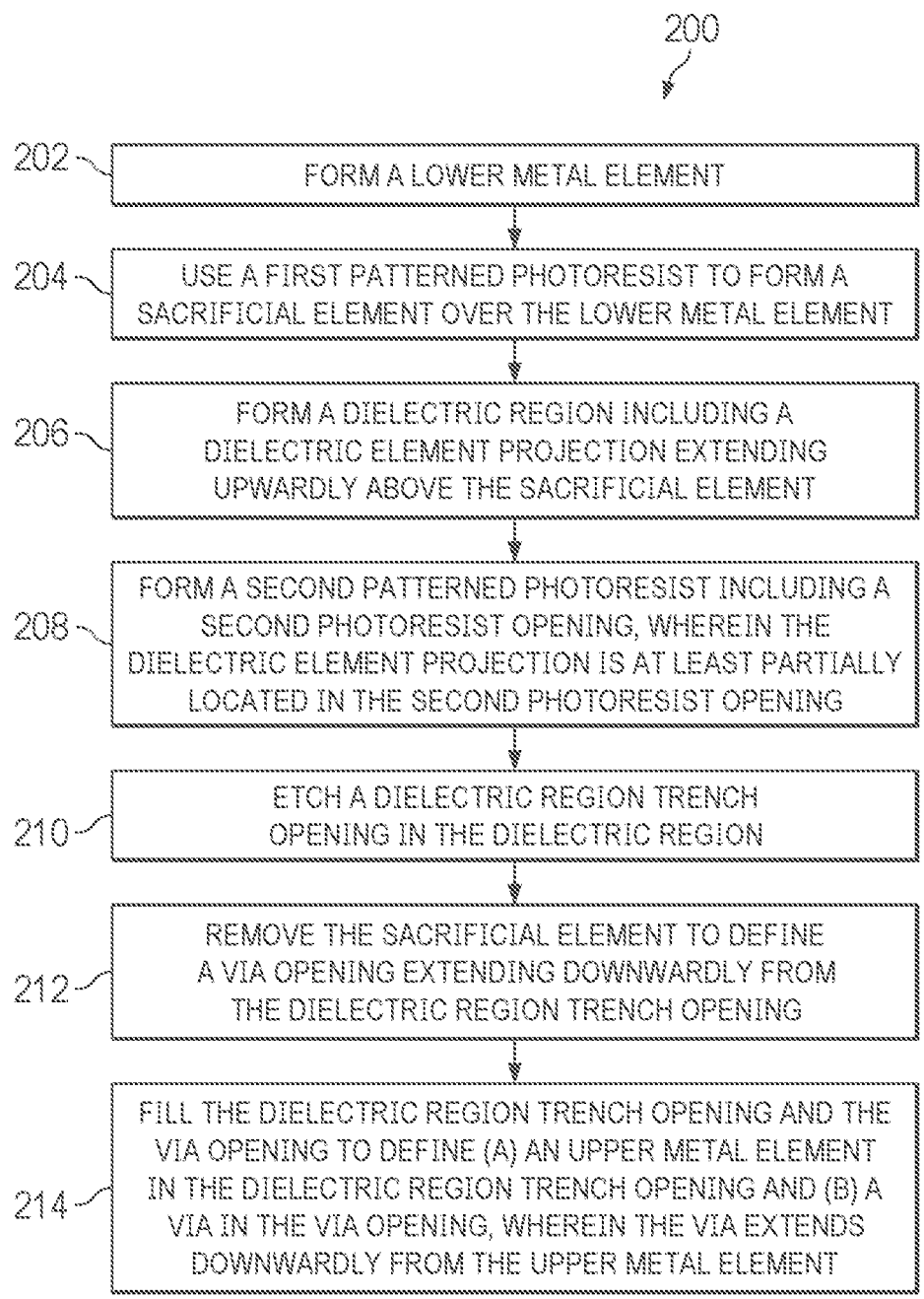
FIG. 2 is a flowchart of a first example method for forming a via in an integrated circuit structure.

FIG. 2 is a flowchart of a first example method 200 for forming a via in an integrated circuit structure. At 202, a lower metal element is formed. At 204, a first patterned photoresist is used to form a sacrificial element over the lower metal element. At 206, a dielectric region is formed, which includes a dielectric element projection extending upwardly above the sacrificial element. At 208, a second patterned photoresist including a second photoresist opening is formed, wherein the dielectric element projection is at least partially located in the second photoresist opening. At 210, a dielectric region trench opening is etched in the dielectric region. At 212, the sacrificial element is removed to define a via opening extending downwardly from the dielectric region trench opening. At 212, the dielectric region trench opening and the via opening are filled to define (a) an upper metal element in the dielectric region trench opening and (b) a via in the via opening, wherein the via extends downwardly from the upper metal element.

Figure 3:
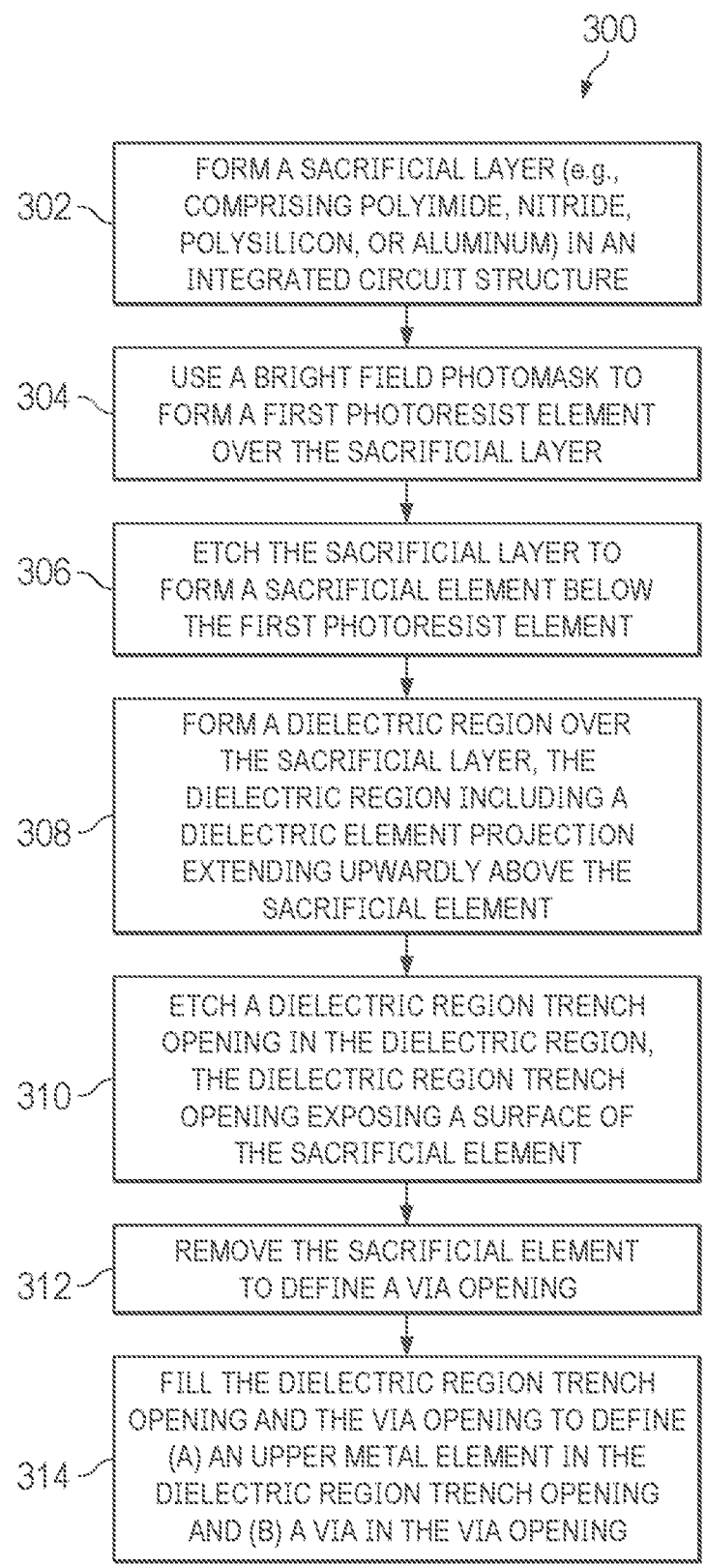
FIG. 3 is a flowchart of a second example method for forming a via in an integrated circuit structure.

FIG. 3 is a flowchart of a second example method 300 for forming a via in an integrated circuit structure. At 302, a sacrificial material layer (e.g., comprising polyimide, nitride, polysilicon, or aluminum) is formed in an integrated circuit structure. At 304, a bright field photomask is used to define a first photoresist element over the sacrificial material layer. At 306, the sacrificial material layer is etched to form a sacrificial element below the first photoresist element. At 308, a dielectric region is formed over the sacrificial material layer, the dielectric region including a dielectric element projection extending upwardly above the sacrificial element. At 310, a dielectric region trench opening is etched in the dielectric region, the dielectric region trench opening exposing a surface of the sacrificial element. At 312, the sacrificial element is removed to define a via opening. At 314, the dielectric region trench opening and the via opening are filled to define (a) an upper metal element in the dielectric region trench opening and (b) a via in the via opening.

Figure 4:
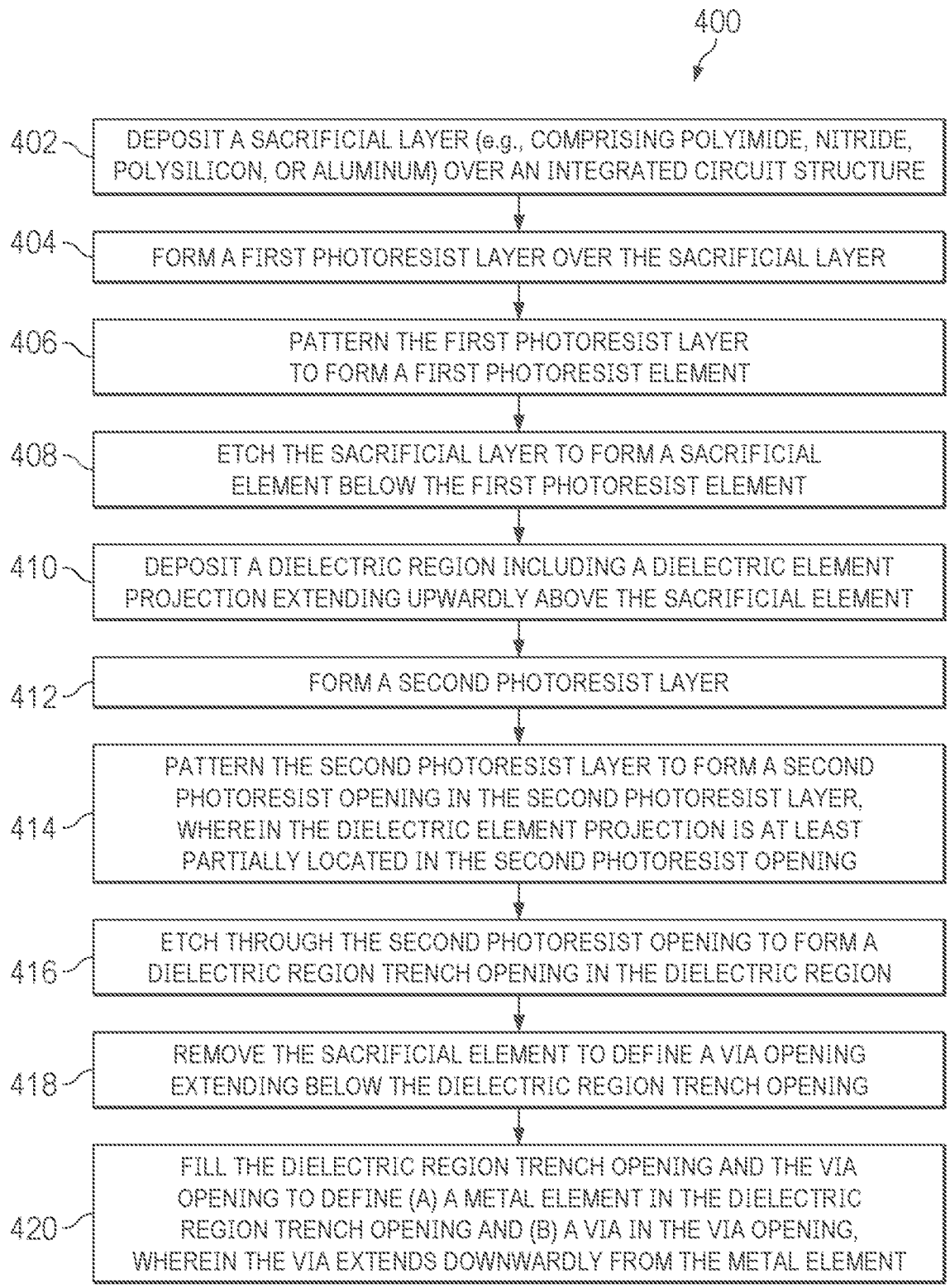
FIG. 4 is a flowchart of a third example method for forming a via in an integrated circuit structure.

FIG. 4 is a flowchart of a third example method 400 for forming a via in an integrated circuit structure. At 402, a sacrificial material layer (e.g., comprising polyimide, nitride, polysilicon, or aluminum) is deposited over an integrated circuit structure. At 404, a first photoresist layer is formed over the sacrificial material layer. At 406, the first photoresist layer is patterned to define a first photoresist element. At 408, the sacrificial material layer is etched to form a sacrificial element below the first photoresist element. At 410, a dielectric region is formed, which includes a dielectric element projection extending upwardly above the sacrificial element. At 412, a second photoresist layer is formed. At 414, the second photoresist layer is patterned to form a second photoresist opening in the second photoresist layer, wherein the dielectric element projection is at least partially located in the second photoresist opening. At 414, an etch is performed to etch through the second photoresist opening to form a dielectric region trench opening in the dielectric region. At 416, the sacrificial element is removed to define a via opening extending below the dielectric region trench opening. At 418, the dielectric region trench opening and the via opening are filled to define (a) a metal element in the dielectric region trench opening and (b) a via in the via opening, wherein the via extends downwardly from the metal element.

The invention claimed is:

1. A method, comprising:
    depositing a sacrificial material layer over an integrated circuit structure;
    forming a first photoresist layer over the sacrificial material layer;
    patterning the first photoresist layer to define a first photoresist element;
    etching the sacrificial material layer to form a sacrificial element below the first photoresist element;
    depositing a dielectric region including a dielectric element projection extending upwardly above the sacrificial element;
    forming a second photoresist layer;
    patterning the second photoresist layer to form a second photoresist opening in the second photoresist layer, wherein at least a portion of the dielectric element projection extends upwardly in the second photoresist opening, wherein an alignment of the second photoresist opening relative to the dielectric element projection defines an interference area between the second photoresist layer and the dielectric element projection, and wherein the second photoresist layer is physically excluded from the interference area by the dielectric element projection;
    etching through the second photoresist opening to form a dielectric region trench opening in the dielectric region;
    removing the sacrificial element to define a via opening extending below the dielectric region trench opening; and
    filling the dielectric region trench opening and the via opening to define (a) a metal element in the dielectric region trench opening and (b) a via in the via opening, wherein the via extends downwardly from the metal element.

2. The method of claim 1, wherein patterning the first photoresist layer to define the first photoresist element comprises using a bright field photomask to pattern the first photoresist layer.

3. The method of claim 1, wherein:
the first photoresist element comprises a vertically-extending photoresist pillar; and
the sacrificial element comprises a vertically-extending sacrificial pillar.

4. The method of claim 1, wherein the sacrificial element is laterally misaligned with the second photoresist opening.

5. The method of claim 3, wherein a perimeter of the sacrificial element extends laterally beyond a perimeter of the second photoresist opening.

6. The method of claim 1, comprising filling the dielectric region trench opening and the via opening using a dual damascene process.

7. The method of claim 1, wherein the sacrificial material layer comprises polyimide.

8. The method of claim 1, wherein the sacrificial material layer comprises nitride, polysilicon, or aluminum.

9. The method of claim 1, comprising etching the sacrificial element to reduce a lateral width of the sacrificial element before depositing the dielectric region.

10. The method of claim 1, comprising:
forming an anti-reflective coating over the dielectric region, the anti-reflective coating including a cap portion covering an upper portion of the dielectric element projection;
forming the second photoresist layer over the anti-reflective coating;
after patterning the second photoresist layer to form the second photoresist opening, removing the cap portion of the anti-reflective coating; and
removing at least a partial vertical height of the dielectric element projection.

11. The method of claim 1, wherein the dielectric element projection projects upwardly higher than a top surface of the second photoresist layer.

12. The method of claim 1, wherein the deposited dielectric region encloses the sacrificial element.

13. A method, comprising:
forming a lower metal element;
using a first patterned photoresist to form a sacrificial element over the lower metal element;
forming a dielectric region including a dielectric element projection extending upwardly above the sacrificial element;
forming a second patterned photoresist including a second photoresist opening, wherein at least a portion of the dielectric element projection extends upwardly in the second photoresist opening, wherein an alignment of the second photoresist opening relative to the dielectric element projection defines an interference area between the second photoresist layer and the dielectric element projection, and wherein the second photoresist layer is physically excluded from the interference area by the dielectric element projection;
etching a dielectric region trench opening in the dielectric region;
removing the sacrificial element to define a via opening extending downwardly from the dielectric region trench opening; and
filling the dielectric region trench opening and the via opening to define (a) an upper metal element in the dielectric region trench opening and (b) a via in the via opening, wherein the via extends downwardly from the upper metal element.

14. The method of claim 13, wherein using a first patterned photoresist to form the sacrificial element over the lower metal element comprises:
patterning a first photoresist using a bright field photomask to define a first photoresist element; and
etching the sacrificial material layer to form a sacrificial element below the first photoresist element.

15. The method of claim 13, comprising filling the dielectric region trench opening and the via opening using a dual damascene process.

16. The method of claim 13, comprising:
forming an anti-reflective coating over the dielectric region, the anti-reflective coating including a cap portion covering an upper portion of the dielectric element projection;
forming the second photoresist layer over the anti-reflective coating;
after forming the second patterned photoresist including the second photoresist opening, removing the cap portion of the anti-reflective coating; and
removing at least a partial vertical height of the dielectric element projection.

17. The method of claim 13, wherein a perimeter of the sacrificial element extends laterally beyond a perimeter of the second photoresist opening.

18. A method, comprising:
forming a sacrificial material layer in an integrated circuit structure;
using a bright field photomask to define a first photoresist element over the sacrificial material layer;
etching the sacrificial material layer to form a sacrificial element below the first photoresist element,
forming a dielectric region over the sacrificial material layer, the dielectric region including a dielectric element projection extending upwardly above the sacrificial element;
forming a second patterned photoresist including a second photoresist opening, wherein at least a portion of the dielectric element projection extends upwardly in the second photoresist opening wherein an alignment of the second photoresist opening relative to the dielectric element projection defines an interference area between the second photoresist layer and the dielectric element projection, and wherein the second photoresist layer is physically excluded from the interference area by the dielectric element projection;
etching through the second photoresist opening to form a dielectric region trench opening in the dielectric region, the dielectric region trench opening exposing a portion of a surface of the sacrificial element;
removing the sacrificial element to define a via opening; and
filling the dielectric region trench opening and the via opening to define (a) an upper metal element in the dielectric region trench opening and (b) a via in the via opening.

19. The method of claim 18, comprising:
forming the sacrificial material layer over a lower metal element;
wherein the via opening defined by removing the sacrificial element exposes an upper surface of the lower metal element.

20. An integrated circuit device formed by a process including:
- depositing a sacrificial material layer over an integrated circuit structure;
- forming a first photoresist layer over the sacrificial material layer;
- patterning the first photoresist layer to define a first photoresist element;
- etching the sacrificial material layer to form a sacrificial element below the first photoresist element;
- depositing a dielectric region including a dielectric element projection extending upwardly above the sacrificial element;
- forming a second photoresist layer;
- patterning the second photoresist layer to form a second photoresist opening in the second photoresist layer, wherein at least a portion of the dielectric element projection extends upwardly in the second photoresist opening, wherein an alignment of the second photoresist opening relative to the dielectric element projection defines an interference area between the second photoresist layer and the dielectric element projection, and wherein the second photoresist layer is physically excluded from the interference area by the dielectric element projection;
- etching through the second photoresist opening to form a dielectric region trench opening in the dielectric region;
- removing the sacrificial element to define a via opening extending below the dielectric region trench opening; and
- filling the dielectric region trench opening and the via opening to define (a) a metal element in the dielectric region trench opening and (b) a via in the via opening, wherein the via extends downwardly from the metal element.

* * * * *